US012648400B2

(12) United States Patent (10) Patent No.: US 12,648,400 B2
Goto et al. (45) Date of Patent: Jun. 2, 2026

(54) SUBSTRATE TRANSFER METHOD AND SEMICONDUCTOR MANUFACTURING SYSTEM

(71) Applicant: Tokyo Electron Limited, Tokyo (JP)

(72) Inventors: Ryota Goto, Yamanashi (JP); Hiroshi Hirose, Yamanashi (JP); Kiyoshi Suzuki, Yamanashi (JP); Koichi Miyashita, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 18/842,565

(22) PCT Filed: Feb. 20, 2023

(86) PCT No.: PCT/JP2023/006072

§ 371 (c)(1),
(2) Date: Aug. 29, 2024

(87) PCT Pub. No.: WO2023/167043

PCT Pub. Date: Sep. 7, 2023

(65) Prior Publication Data

US 2025/0174478 A1 May 29, 2025

(30) Foreign Application Priority Data

Mar. 3, 2022 (JP) ................................. 2022-032880

(51) Int. Cl.
H10P 72/30 (2026.01)
H10P 72/00 (2026.01)
H10P 72/50 (2026.01)

(52) U.S. Cl.
CPC ...... H10P 72/3304 (2026.01); H10P 72/0461 (2026.01); H10P 72/0606 (2026.01); H10P 72/3311 (2026.01); H10P 72/50 (2026.01)

(58) Field of Classification Search
CPC ............. H10P 72/3304; H10P 72/0461; H10P 72/0606; H10P 72/3311; H10P 72/50; H10P 72/30; H10P 72/3302; H10P 72/7621

See application file for complete search history.

(56) References Cited

FOREIGN PATENT DOCUMENTS

JP 2020-061472 4/2020

*Primary Examiner* — Abby Lin
*Assistant Examiner* — Renee LaRose
(74) *Attorney, Agent, or Firm* — IPUSA, PLLC

(57) ABSTRACT

A semiconductor manufacturing system includes a plurality of transfer modules, a pass module, and one or more process modules. In a substrate transfer method, a transfer robot is controlled to transfer a substrate from one of the transfer modules to a process module connected to the other transfer module via a pass module. In the substrate transfer method, when a plurality of substrates are transferred, it is determined whether to perform one-by-one correction in which positions of a plurality of substrates are corrected on a one-by-one basis and placed on a plurality of stages of the pass module, or to perform average correction in which an average value of positions of a plurality of substrates with respect to the plurality of stages is obtained and the plurality of substrates are placed collectively.

10 Claims, 12 Drawing Sheets

FIG.7

| PATTERN | FIRST SUBSTRATE PROCESSING | TRANSFER MODULE | VIA | TRANSFER MODULE | SECOND SUBSTRATE PROCESSING |
|---|---|---|---|---|---|
| 1-1 | PM1 | →TM1→ | PASM | →TM2→ | PM4 |
| 1-2 | PM1 | →TM1→ | PASM | →TM2→ | PM5 |
| 1-3 | PM1 | →TM1→ | PASM | →TM2→ | PM6 |
| 1-4 | PM2 | →TM1→ | PASM | →TM2→ | PM4 |
| 1-5 | PM2 | →TM1→ | PASM | →TM2→ | PM5 |
| 1-6 | PM2 | →TM1→ | PASM | →TM2→ | PM6 |
| 2-1 | PM4 | →TM2→ | PASM | →TM1→ | PM1 |
| 2-2 | PM4 | →TM2→ | PASM | →TM1→ | PM2 |
| 2-3 | PM5 | →TM2→ | PASM | →TM1→ | PM1 |
| 2-4 | PM5 | →TM2→ | PASM | →TM1→ | PM2 |
| 2-5 | PM6 | →TM2→ | PASM | →TM1→ | PM1 |
| 2-6 | PM6 | →TM2→ | PASM | →TM1→ | PM2 |

FIG.9

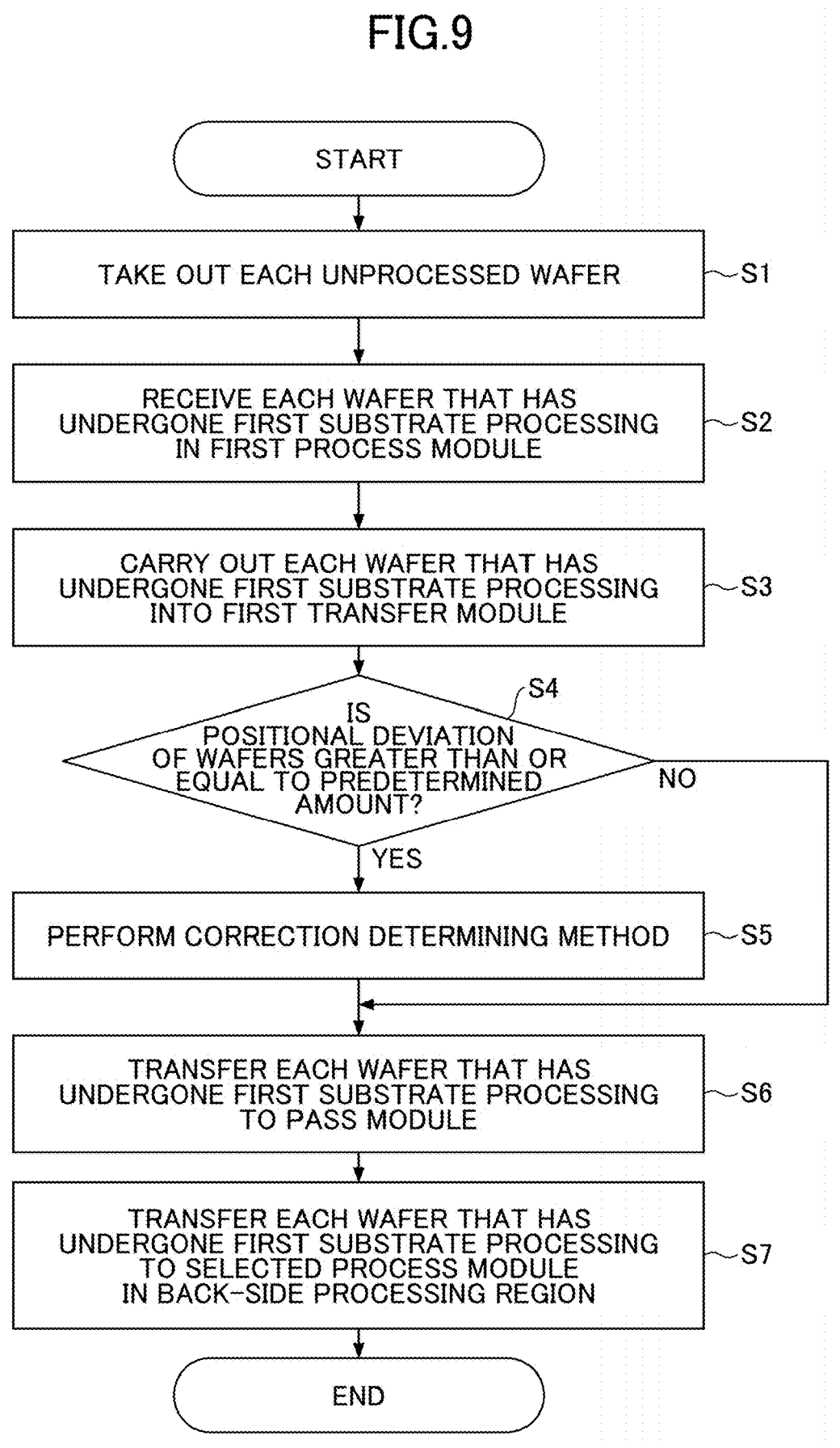

START

TAKE OUT EACH UNPROCESSED WAFER — S1

RECEIVE EACH WAFER THAT HAS
UNDERGONE FIRST SUBSTRATE PROCESSING
IN FIRST PROCESS MODULE — S2

CARRY OUT EACH WAFER THAT HAS
UNDERGONE FIRST SUBSTRATE PROCESSING
INTO FIRST TRANSFER MODULE — S3

S4

IS
POSITIONAL DEVIATION
OF WAFERS GREATER THAN OR
EQUAL TO PREDETERMINED
AMOUNT?

NO

YES

PERFORM CORRECTION DETERMINING METHOD — S5

TRANSFER EACH WAFER THAT HAS
UNDERGONE FIRST SUBSTRATE PROCESSING
TO PASS MODULE — S6

TRANSFER EACH WAFER THAT HAS
UNDERGONE FIRST SUBSTRATE PROCESSING
TO SELECTED PROCESS MODULE
IN BACK-SIDE PROCESSING REGION — S7

END

FIG.11

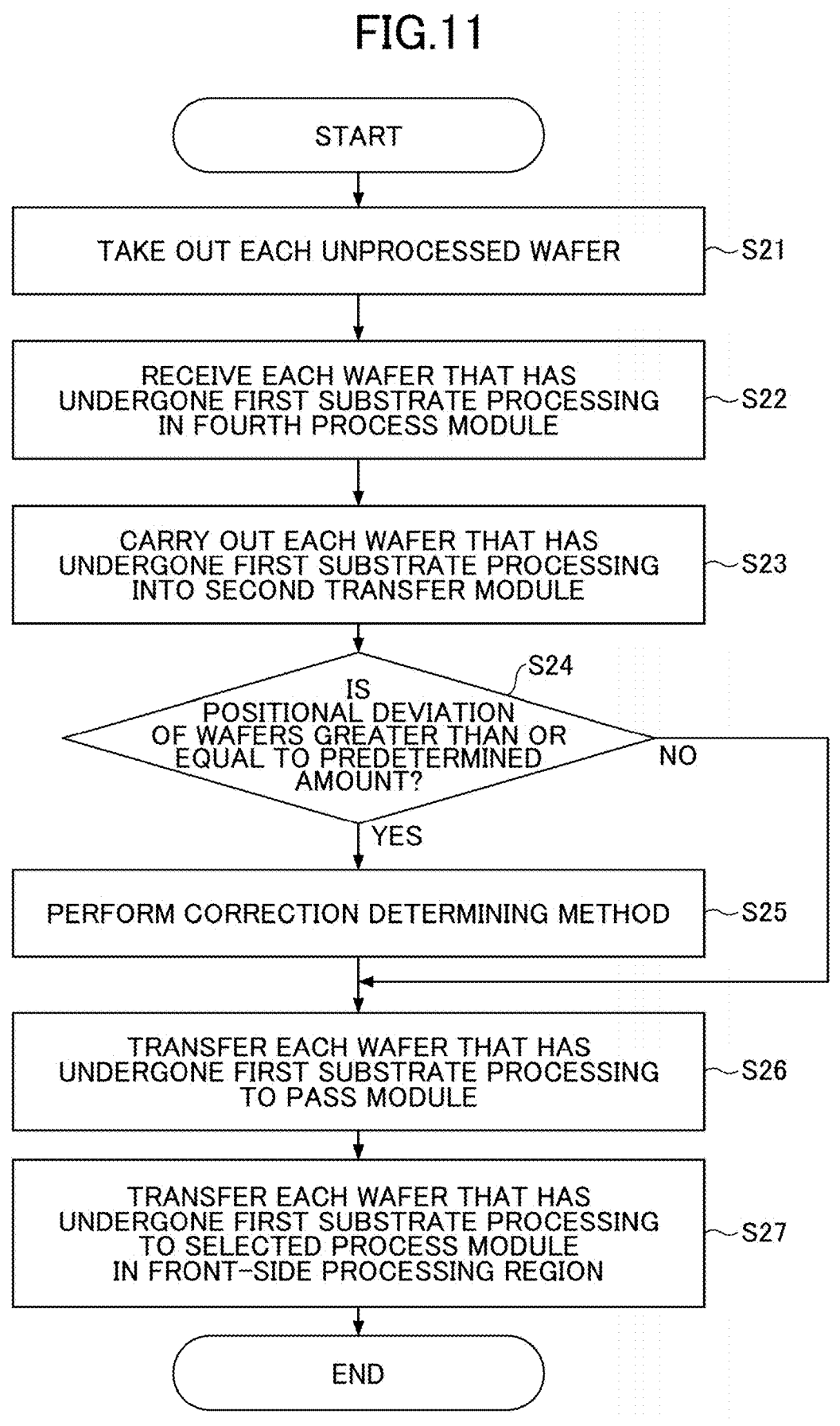

START

TAKE OUT EACH UNPROCESSED WAFER — S21

RECEIVE EACH WAFER THAT HAS
UNDERGONE FIRST SUBSTRATE PROCESSING
IN FOURTH PROCESS MODULE — S22

CARRY OUT EACH WAFER THAT HAS
UNDERGONE FIRST SUBSTRATE PROCESSING
INTO SECOND TRANSFER MODULE — S23

IS
POSITIONAL DEVIATION
OF WAFERS GREATER THAN OR
EQUAL TO PREDETERMINED
AMOUNT? — S24

NO

YES

PERFORM CORRECTION DETERMINING METHOD — S25

TRANSFER EACH WAFER THAT HAS
UNDERGONE FIRST SUBSTRATE PROCESSING
TO PASS MODULE — S26

TRANSFER EACH WAFER THAT HAS
UNDERGONE FIRST SUBSTRATE PROCESSING
TO SELECTED PROCESS MODULE
IN FRONT-SIDE PROCESSING REGION — S27

END

SUBSTRATE TRANSFER METHOD AND SEMICONDUCTOR MANUFACTURING SYSTEM

TECHNICAL FIELD

The present disclosure relates to a substrate transfer method and a semiconductor manufacturing system.

BACKGROUND ART

Patent Document 1 discloses a substrate processing system (semiconductor manufacturing system) in which a plurality of substrates are collectively transferred by a transfer device and the substrates are placed on a plurality of placing portions provided in a processing chamber. In this type of semiconductor manufacturing system, when a plurality of substrates are placed on each of a plurality of placing portions (stages), it is necessary to transfer each substrate while paying attention to the position of the substrate relative to each stage. Therefore, when a substrate held by a transfer robot is positionally deviated, when placing each substrate on each stage, a correction process is performed in which the transfer robot is moved in the horizontal direction to correct the position of each substrate.

CITATION LIST

Patent Document

Patent Document 1: Japanese Unexamined Patent Application Publication No. 2020-61472

SUMMARY OF INVENTION

Technical Problem

The present disclosure provides a technology that can improve the accuracy of placing a substrate on a stage while improving the transfer efficiency of the substrate.

Solution to Problem

According to an aspect of the present disclosure, there is provided
a substrate transfer method of transferring a plurality of substrates, the substrate transfer method involving
a plurality of transfer modules provided with a transfer robot configured to transfer the plurality of substrates;
a pass module arranged between the plurality of transfer modules; and
one or more process modules connected to the plurality of transfer modules, the one or more process modules being configured to perform substrate processing on the plurality of substrates transferred by a corresponding transfer module of the plurality of transfer modules,
the substrate transfer method including:
in a case where the substrate is transferred from one of the plurality of transfer modules to the process module connected to another one of the plurality of transfer modules via the pass module by controlling the transfer robot,
when the plurality of substrates are carried into the pass module, making a determination as to whether to perform one-by-one correction in which the plurality of substrates are placed on a plurality of stages of the pass module upon correcting positions of the plurality of substrates on a one-by-one basis or to perform average correction in which the plurality of substrates are placed on the plurality of stages collectively upon taking an average value of the positions of the plurality of substrates.

Advantageous Effects of Invention

According to an embodiment, it is possible to improve the accuracy of placing a substrate on a stage while improving the efficiency of substrate transfer.

BRIEF DESCRIPTION OF DRAWINGS

FIG. 7 is a diagram illustrating a first substrate processing, a second substrate processing, and a pattern of paths between these processes.

FIG. 9 is a flowchart illustrating a substrate transfer method according to an embodiment.

FIG. 11 is a flowchart illustrating a substrate transfer method according to another embodiment.

DESCRIPTION OF EMBODIMENTS

Figure 1:
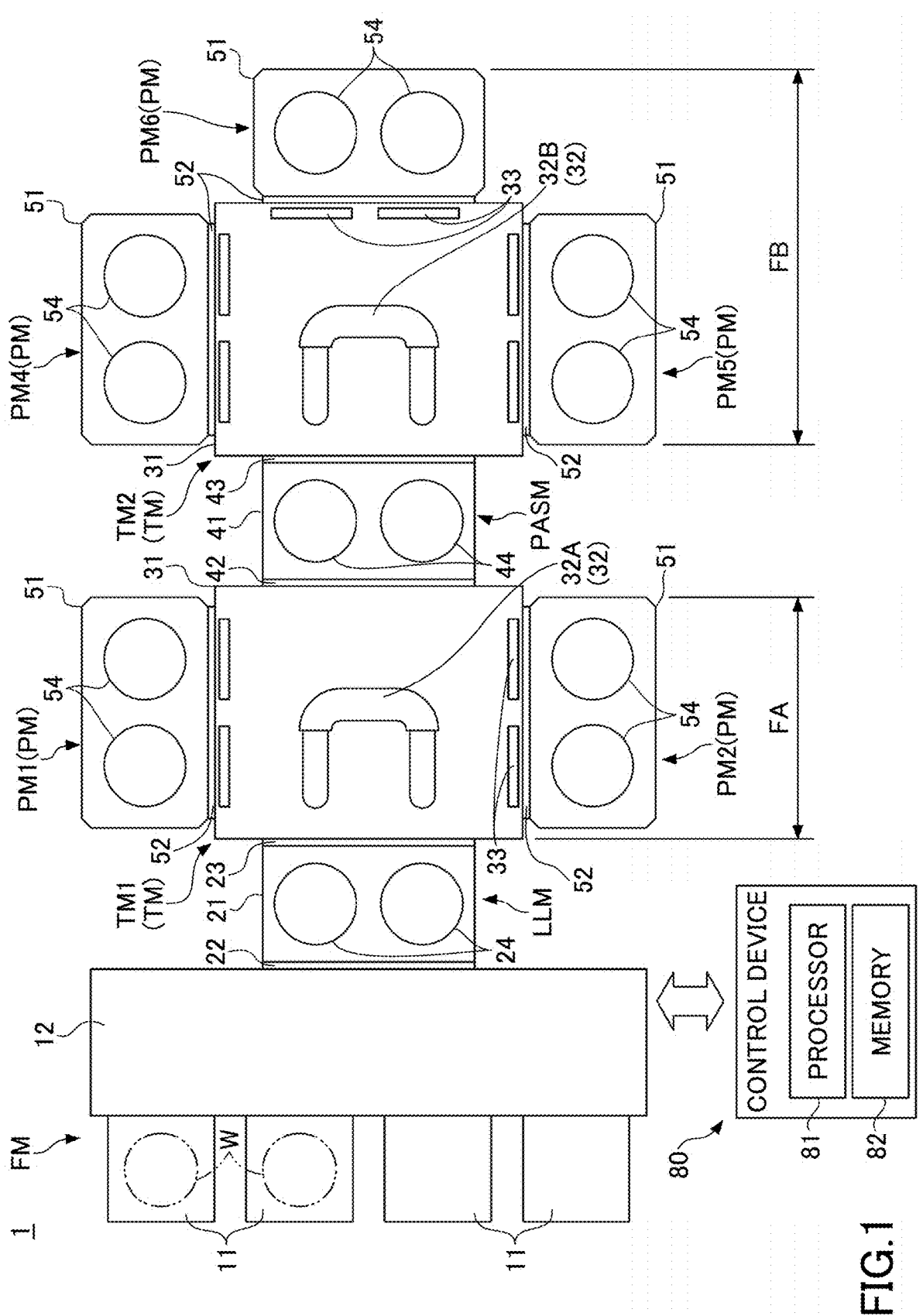
FIG. 1 is a plan view schematically illustrating a semiconductor manufacturing system according to an embodiment.

Hereinafter, an embodiment of the present disclosure will be described with reference to the drawings. In each of the drawings, the same elements are denoted by the same reference numerals, and redundant explanations may be omitted.

As illustrated in FIG. 1, a semiconductor manufacturing system 1 according to an embodiment is configured into a multi-chamber type having a plurality of process modules PM. The semiconductor manufacturing system 1 is used in one process of semiconductor manufacturing, and a substrate is transferred to a predetermined process module PM by a transfer module TM, and appropriate substrate processing is performed in the process module PM.

Examples of substrates to be subjected to substrate processing include silicon semiconductor wafers, compound semiconductor wafers, oxide semiconductor wafers, and the like (hereinafter, the substrate is also referred to as a wafer W). The wafer W may have recessed patterns such as trenches and vias. The substrate processing performed by the process module PM includes film formation processing, etching processing, ashing processing, cleaning processing, and the like.

In order to perform substrate processing of a wafer W in a vacuum atmosphere, the semiconductor manufacturing system 1 carries the wafer W from an atmospheric atmosphere to a vacuum atmosphere and carries the wafer W from the vacuum atmosphere to the atmospheric atmosphere. Specifically, the semiconductor manufacturing system 1 includes a front module FM (for example, EFEM: Equipment Front End Module) and a load-lock module LLM. Further, the semiconductor manufacturing system 1 includes a control device 80 for controlling the operation of the entire system.

The front module FM includes a plurality of load ports 11, a series of loaders 12 adjacent to each load port 11, and an atmosphere transfer device (not illustrated) provided in the loader 12. Each load port 11 is set with a FOUP (Front Opening Unified Pod) in which the wafer W subjected to the processing of the previous process is stored or an empty FOUP. The atmosphere transfer device takes out the wafer W from the FOUP set in each load port 11 and carries the wafer W into the load-lock module LLM through a cleaning space in the loader 12. Further, the atmosphere transfer device carries out the wafer W from the load-lock module LLM and houses the wafer W into the FOUP through a cleaning space in the loader 12.

The load-lock module LLM is provided between the front module FM and the transfer module TM. The load-lock module LLM has a load-lock container 21 switchable between an atmospheric atmosphere and a vacuum atmosphere. A gate 22 is provided between the load-lock module LLM and the front module FM with a valve element (not illustrated) for airtightly closing the load-lock container 21. A gate 23 is provided between the load-lock module LLM and the transfer module TM with a valve element (not illustrated) for airtightly closing the load-lock container 21.

The load-lock container 21 can transfer the wafer W to the transfer module TM by housing the wafer W carried from the front module FM in an atmospheric atmosphere and then reducing the pressure to a vacuum atmosphere. The load-lock container 21 can transfer the wafer W to the front module FM by housing the wafer W carried from the transfer module TM in a vacuum atmosphere and increasing the pressure to an atmospheric atmosphere. The load-lock container 21 may have a configuration in which a carry-in space from the front module FM to the transfer module TM and a carry-out space from the transfer module TM to the front module FM are separated in a vertical direction.

The load-lock module LLM according to the present embodiment includes a plurality (two) of stages 24 capable of separately placing two wafers W inside the load-lock container 21 (each of the carry-in space and the carry-out space). The two stages 24 are arranged along the long side direction of the load-lock module LLM. Thus, each stage 24 can collectively hold two wafers W by a transfer robot 32 of a transfer module TM described later. Although FIG. 1 illustrates an example of the semiconductor manufacturing system 1 for collectively transferring two wafers W, the semiconductor manufacturing system 1 may be configured to collectively transfer three or more wafers W. The number of stages 24 of the load-lock module LLM may be the same as the number of wafers W to be transferred.

The transfer module TM and the plurality of process modules PM perform the wafer W transfer and substrate processing in a vacuum atmosphere. The semiconductor manufacturing system 1 according to the present embodiment includes a plurality (two) of regions including the transfer module TM and the plurality of process modules PM. This is because substrate processing is performed on the wafer W for each region (that is, substrate processing is performed a plurality of times). Hereinafter, with respect to the substrate processing performed a plurality of times, the first processing to be performed on the unprocessed wafer W is referred to as the first substrate processing, and the processing to be performed on the wafer W that has undergone the first substrate processing is referred to as the second substrate processing.

Specifically, the plurality of regions of the semiconductor manufacturing system 1 include a front-side processing region FA provided at a position adjacent to the load-lock module LLM and a back-side processing region FB provided at a position adjacent to the front-side processing region FA. The back-side processing region FB is provided at a position opposite to the load-lock module LLM across the front-side processing region FA.

The front-side processing region FA has a first transfer module TM1, which is one of the plurality of transfer modules TM, and a first process module PM1 and a second process module PM2 connected to the first transfer module TM1. On the other hand, the back-side processing region FB has a second transfer module TM2, which is the other of the plurality of transfer modules TM, and fourth to sixth process modules PM4, PM5, and PM6 connected to the second transfer module TM2. The semiconductor manufacturing system 1 also has a pass module PASM, which can temporarily place a wafer W between the front-side processing region FA and the back-side processing region FB. The transfer of the wafer W from the front-side processing region FA to the back-side processing region FB and the transfer of the wafer W from the back-side processing region FB to the front-side processing region FA are performed through the pass module PASM. In FIG. 1, a pass module PASM is connected in place of a third process module to be connected to the first transfer module TM1, and the semiconductor manufacturing system 1 does not have a third process module.

Each transfer module TM (the first transfer module TM1 and the second transfer module TM2) includes a transfer container 31 capable of decompressing into a vacuum atmosphere, and the transfer robot 32 installed in the transfer container 31. Hereinafter, the transfer robot 32 installed in the first transfer module TM1 is also referred to as the first transfer robot 32A, and the transfer robot 32 installed in the second transfer module TM2 is also referred to as the second transfer robot 32B.

The transfer container 31 is formed into a rectangular box in a plan view. The load-lock module LLM, the pass module PASM, and the plurality of process modules PM are installed on each side of the transfer container 31. The transfer robot 32 is configured to be movable in the horizontal and vertical directions and to be rotatable by θ in the horizontal direction in the transfer container 31. Further, an end effector of the transfer robot 32 in direct contact with the wafers W is bifurcated in order to collectively hold a plurality (two wafers) W.

Figure 2:
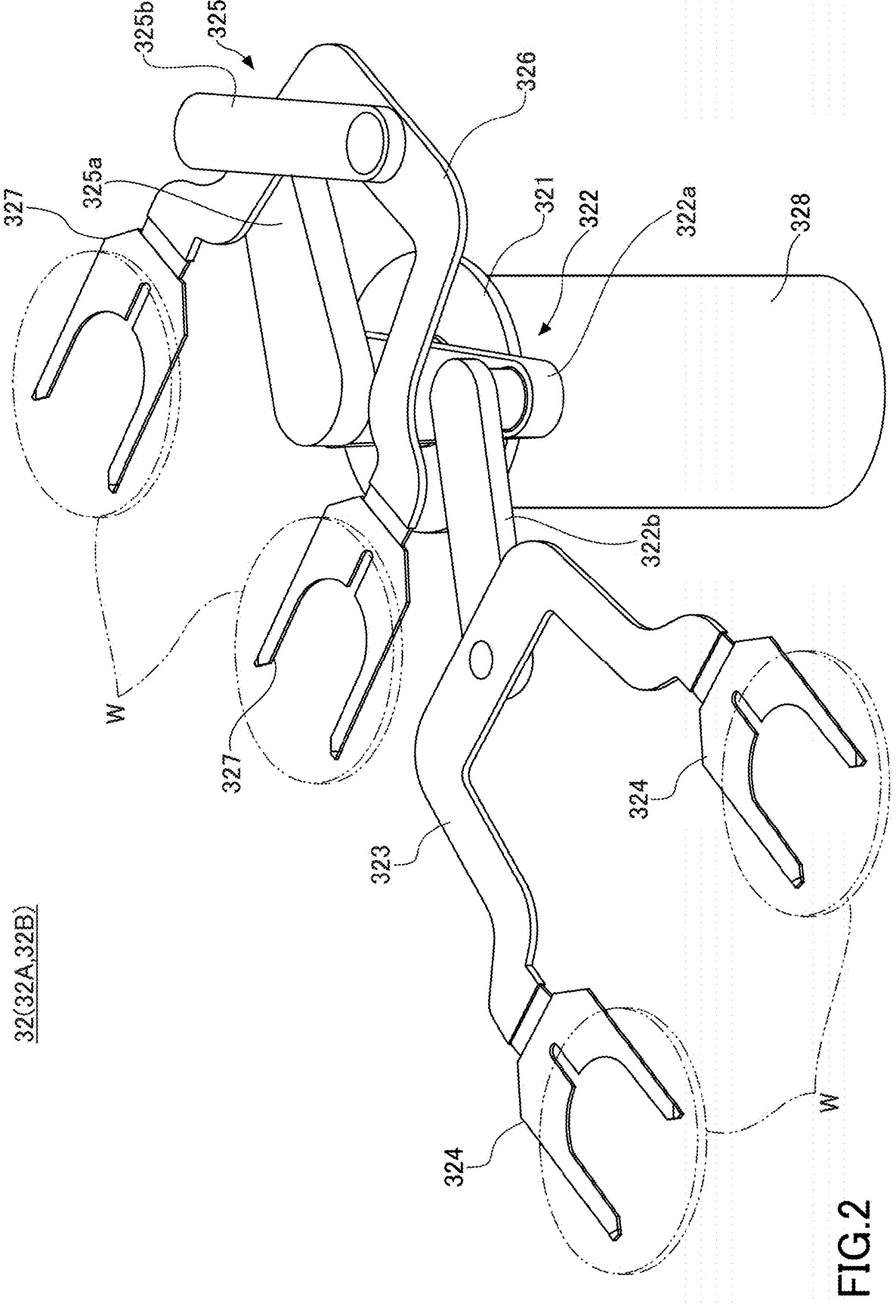
FIG. 2 is a perspective view illustrating a transfer robot provided in a transfer module of a semiconductor manufacturing system.

Further, as illustrated in FIG. 2, the transfer robot 32 is provided with two transfer arms so that the two wafers W can be exchanged (functioning for carry-in and carry-out) with respect to the load-lock module LLM, the pass module PASM, and the process module PM. Specifically, the transfer robot 32 has a base 321, a first transfer arm 322 and a second transfer arm 325 supported by the base 321, and a support shaft 328 for raising and lowering the base 321.

The first transfer arm 322 includes a base link 322*a* rotatably supported by the base 321, an intermediate link 322*b* rotatably supported by the base link 322*a*, and a first end effector 323 rotatably supported by the intermediate link 322*b*. The first end effector 323 is bifurcated from the support of the intermediate link 322*b*, and includes a first fork 324 holding the wafer W at each of the pair of extended ends. The first fork 324 supports the wafer W and is further bifurcated to pass through a lift pin 45 (see FIG. 3 (B)) described below.

Similarly, the second transfer arm 325 also includes a base link 325*a* rotatably supported by the base 321, an intermediate link 325*b* rotatably supported by the base link 325*a*, and a second end effector 326 rotatably supported by the intermediate link 325*b*. The second end effector 326 is also bifurcated from the support of the intermediate link 325*b*, and includes a second fork 327 holding the wafer W at each of the pair of extended ends. The second fork 327 also supports the wafer W and is further bifurcated to pass through the lift pin 45.

The support shaft 328 extends in the vertical direction, and the lower end thereof is connected to a lifting mechanism (not illustrated). The lifting mechanism lifts and lowers the wafer W supported by the first transfer arm 322 or the second transfer arm 325 by lifting and lowering the support shaft 328 under the control of the control device 80.

In the transfer robot 32 configured as described above, the first transfer arm 322 and the second transfer arm 325 can be operated independently of each other. Therefore, for example, with the two wafers W held by the second end effector 326, the first transfer arm 322 can be brought into the process module PM to receive the two wafers W in the process module PM. After the two wafers W in the process module PM are received, the second transfer arm 325 can be brought into the process module PM to deliver the two wafers W of the second end effector 326.

Referring back to FIG. 1, the pass module PASM provided between the first transfer module TM1 and the second transfer module TM2 has a PAS container 41 connected to each transfer container 31. A gate 42 provided with a valve element (not illustrated) for airtightly closing the PAS container 41 is provided between the pass module PASM and the first transfer module TM1. A gate 43 provided with a valve element (not illustrated) for airtightly closing the PAS container 41 is provided between the pass module PASM and the second transfer module TM2. Note that the semiconductor manufacturing system 1 may have a configuration in which the two transfer containers 31 and the PAS container 41 are communicated without the gates 42 and 43. The PAS container 41 may have a configuration in which a space for moving the wafer W from the first transfer module TM1 to the second transfer module TM2 and a space for moving the wafer W from the second transfer module TM2 to the first transfer module TM1 are separated in the vertical direction.

The pass module PASM is provided with a plurality (two) of stages 44 capable of separately placing two wafers W inside the PAS container 41. The two stages 44 are arranged along the long side direction of the pass module PASM. Thus, each stage 44 can receive the two wafers W from the transfer robot 32 and deliver the two wafers W to the transfer robot 32. Similarly to the load-lock module LLM, the number of stages 44 installed in the pass module PASM is not limited, and there may be provided a number of stages 44 equal to the number of wafers W to be transferred. The pass module PASM may be provided with a detector for detecting the housing state of the wafer W in the PAS container 41 (whether or not the wafer W is housed). The information of the detector can be used for processing by the control device 80.

On the other hand, two process modules PM are connected to the first transfer module TM1 and three process modules PM are connected to the second transfer module TM2. That is, the semiconductor manufacturing system 1 according to the present embodiment includes five process modules PM.

The first process module PM1 and the second process module PM2 are connected to the first transfer module TM1 in a direction perpendicular to the direction in which the load-lock module LLM and the pass module PASM are aligned. The fourth process module PM4 and the fifth process module PM5 are connected to the second transfer module TM2 in a direction perpendicular to the direction in which the pass module PASM and the second transfer module TM2 are aligned. The sixth process module PM6 is disposed on the side opposite of the pass module PASM in the second transfer module TM2 (the direction in which the pass module PASM and the second transfer module TM2 are aligned).

Each process module PM has a processing container 51 in which a wafer W is housed to perform substrate processing. The processing container 51 is formed in a substantially rectangular shape in a plan view. Gates 52 are provided between the transfer container 31 and each processing container 51 to communicate with each other and allow the wafer W to pass therethrough, and valves (not illustrated) for opening and closing the processing container 51 are provided in each gate 52.

Each process module PM has a plurality (two) of stages 54 in which two wafers W can be separately placed in the processing container 51. The two stages 54 are arranged so as to line up along the long side direction of each process module PM. Thus, each stage 54 can receive the two wafers W from the transfer robot 32 and deliver the two wafers W to the transfer robot 32. The number of stages 54 installed in the process module PM is not limited, and the number of stages 54 may be the same as the number of wafers W to be transferred. The processing container 51 may have a configuration in which a plurality of stages 54 are disposed in a common internal space, or a configuration in which an internal space is isolated for each of the plurality of stages 54, provided that the wafers W can be carried in and out of the gate 52.

The substrate processing performed by each process module PM may be any of the above-described film formation processing, etching processing, ashing processing, cleaning processing, and the like. However, the first process module PM1 and the second process module PM2 constituting at least the front-side processing region FA perform the same substrate processing as each other. Similarly, the fourth to sixth process modules PM4, PM5, and PM6 constituting at least the back-side processing region FB perform the same substrate processing as each other. The semiconductor manufacturing system 1 may be configured to perform the same substrate processing in all of the first process module PM1 and the second process module PM2 and the fourth to sixth process modules PM4, PM5, and PM6.

Further, the semiconductor manufacturing system 1 is provided with a position detector 33 for detecting the positions of the two wafers W transferred by the transfer robot 32 at positions adjacent to the process modules PM (gates 52) in the transfer modules TM. The position detector 33 has, for example, two shading sensors (not illustrated) for the transfer path of one wafer w. When the two wafers W held by the transfer robot 32 are transferred from the transfer container 31 to the processing container 51, the shading sensors detect the edges of the wafers W facing each other. Thus, the position of the wafer W by the transfer robot 32 (relative position of the wafer W to the transfer robot 32) can be detected. That is, the position detectors 33 can detect the amount of positional deviation of the actually held wafers W from the reference holding position of the transfer robot 32. The position detectors 33 are communicably connected to the control device 80, and transmit, to the control device 80, detection information of the wafer W detected when the wafer W is transferred.

Note that the position detectors 33 are not only installed at positions adjacent to the process modules PM in the transfer module TM, but may also be installed at positions adjacent to the load-lock module LLM or the pass module PASM. Thus, the semiconductor manufacturing system 1 can detect the position of the wafer W even when the transfer robot 32 transfers two wafers W from the load-lock module LLM or the pass module PASM. The position detectors 33 are not limited to the configuration installed in the transfer module TM, but may also be installed in the process module PM.

The control device 80 of the semiconductor manufacturing system 1 may be a computer having a processor 81, a memory 82, an input/output interface (not illustrated), an electronic circuit, etc. The processor 81 may be a combination of one or more of a CPU (Central Processing Unit), a GPU (Graphics Processing Unit), an ASIC (Application Specific Integrated Circuit), an FPGA (Field-Programmable Gate Array), a circuit including a plurality of discrete semiconductors, etc. The memory 82 may be an appropriate combination of a volatile memory and a nonvolatile memory (for example, a compact disc, a DVD (Digital Versatile Disc), a hard disk, a flash memory, etc.).

The memory 82 stores a program for operating the semiconductor manufacturing system 1, a recipe for process conditions of substrate processing, etc. The processor 81 reads and executes a program in the memory 82 to control each configuration of the semiconductor manufacturing system 1. The semiconductor manufacturing system 1 may have a configuration in which a controller (not illustrated) is provided for each module, and the control device 80 instructs each controller to control the entire system, or the control device 80 may have a configuration in which the operation of each module is unitarily controlled. The control device 80 may be configured by a host computer or a plurality of client computers that communicate information via a network.

When the transfer robot 32 transfers the two wafers W, the control device 80 detects the position of each wafer W by the position detector 33 and determines the positional deviation of each wafer W with respect to the transfer robot 32. When a positional deviation occurs in at least one of the two wafers W, the control device 80 performs correction processing corresponding to the positional deviation of the wafer W. Specifically, when the wafer W is placed on the stage 44 of the pass module PASM or the stage 54 of the process module PM, the control device 80 adjusts the horizontal movement of the transfer robot 32 to properly place the two wafers W on the stages 44 and 54.

Next, the correction processing corresponding to the positional deviation of the wafer W when the semiconductor manufacturing system 1 transfers the wafer W will be described. Although the operation when the wafer W is placed on the two stages 44 provided in the pass module PASM will be described below, the semiconductor manufacturing system 1 can also perform the same correction processing when the wafer W is placed on the two stages 54 of the process module PM. Alternatively, the semiconductor manufacturing system 1 may also perform the same correction processing when the wafer W is placed on the two stages 24 of the load-lock module LLM.

Figure 3:
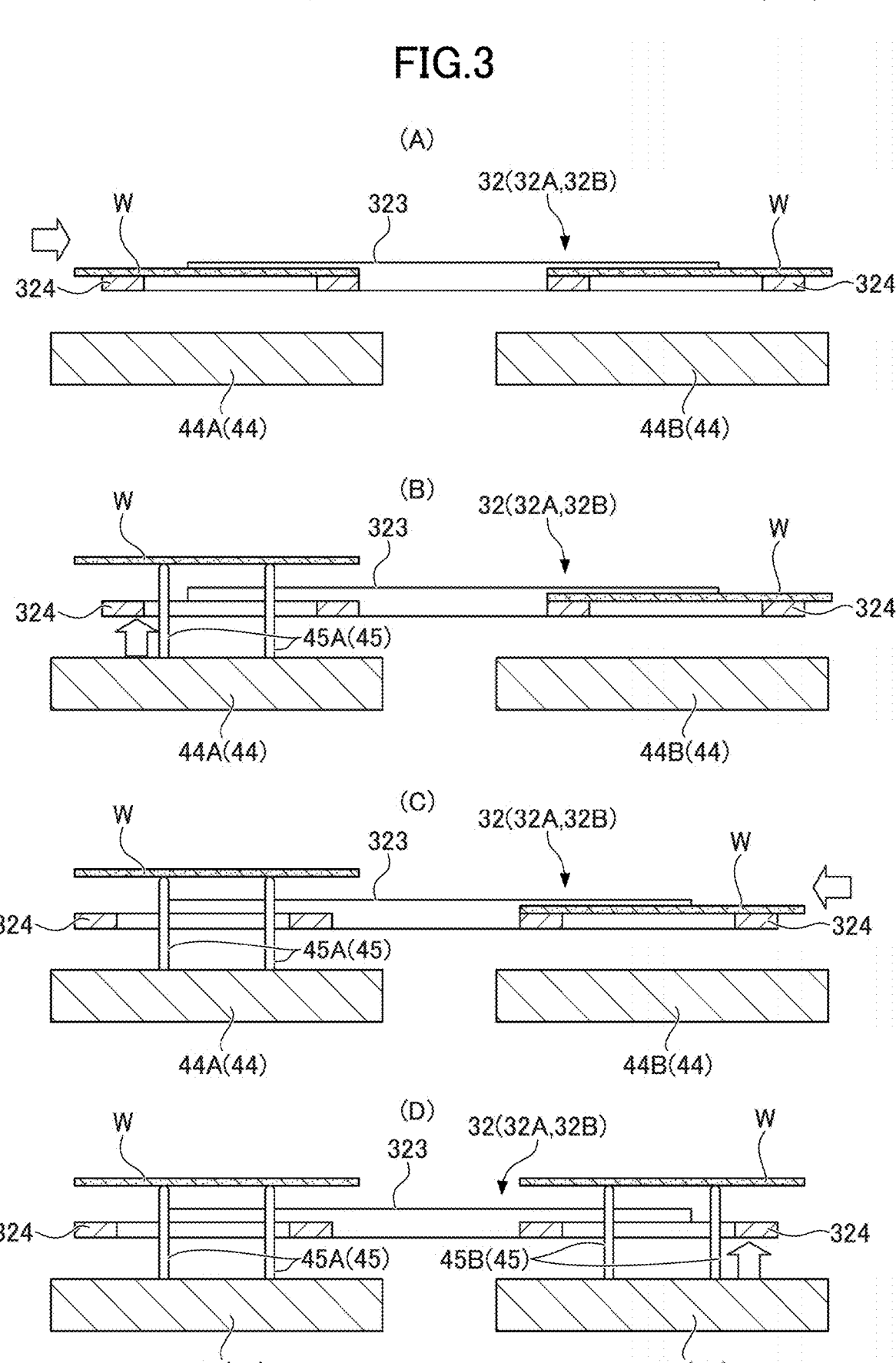
FIG. 3 is a cross-sectional view schematically illustrating operation of one-by-one correction by the transfer robot.

As illustrated in FIG. 3, the first end effector 323 of the transfer robot 32 holds the two wafers W, enters the PAS container 41, and moves the wafers W onto the two stages 44 (a first stage 44A, a second stage 44B). In FIG. 3, the wafer W is held by the pair of first forks 324 of the first end effector 323 in a state where the wafer W is positionally deviated. In this case, when each wafer W is placed on a corresponding stage 44 as a correction process, the control device 80 performs one-by-one correction for correcting the position of each wafer. For example, in the one-by-one correction, the positional deviation of the wafer W to be placed on the first stage 44A is corrected first and the wafer W is delivered to the first stage 44A, and then the positional deviation of the wafer W to be placed on the second stage 44B is corrected and the wafer W is delivered to the second stage 44B.

More specifically, as illustrated in FIG. 3 (A), the control device 80 controls the transfer robot 32 to move the first end effector 323 in the horizontal direction so that the center of the wafer W coincides with the center of the first stage 44A. At this time, the control device 80 ignores the relative position of the wafer W to be placed on the second stage 44B and the second stage 44B, and gives priority to the horizontal positioning of the wafer W to be placed on the first stage 44A. Accordingly, while the center of the first stage 44A and the center of the wafer W coincide in a corrected state, the center of the second stage 44B is largely positionally deviated from the center of the second stage 44B.

When the wafer W is in the corrected state on the first stage 44A side, the control device 80 raises the plurality of lift pins 45 (the first lift pins 45A) housed in the first stage 44A and raises the wafer W above the first fork 324, as illustrated in FIG. 3 (B).

Figure 4:
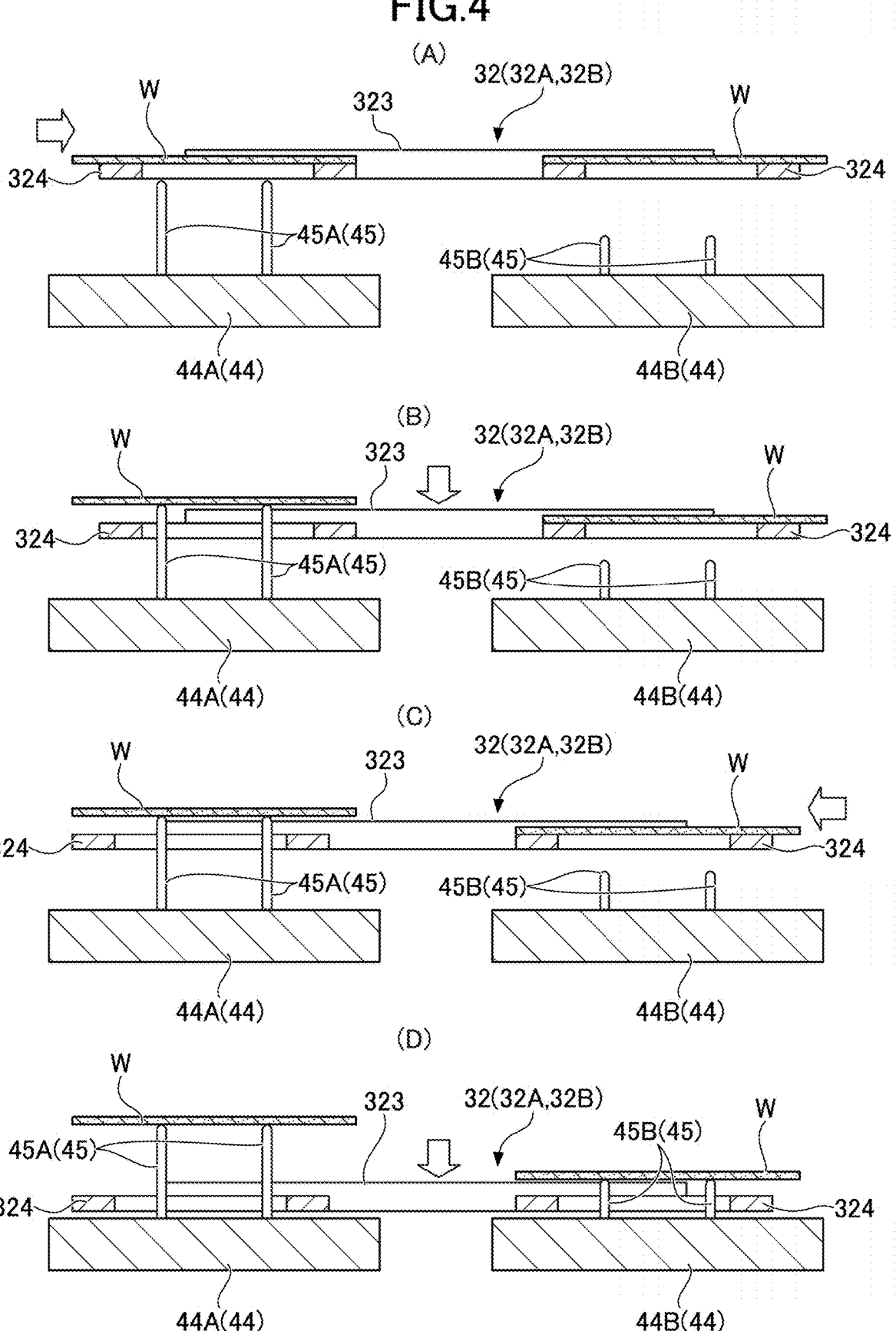
FIG. 4 is a cross-sectional view schematically illustrating another operation of one-by-one correction by the transfer robot.
Figure 5:
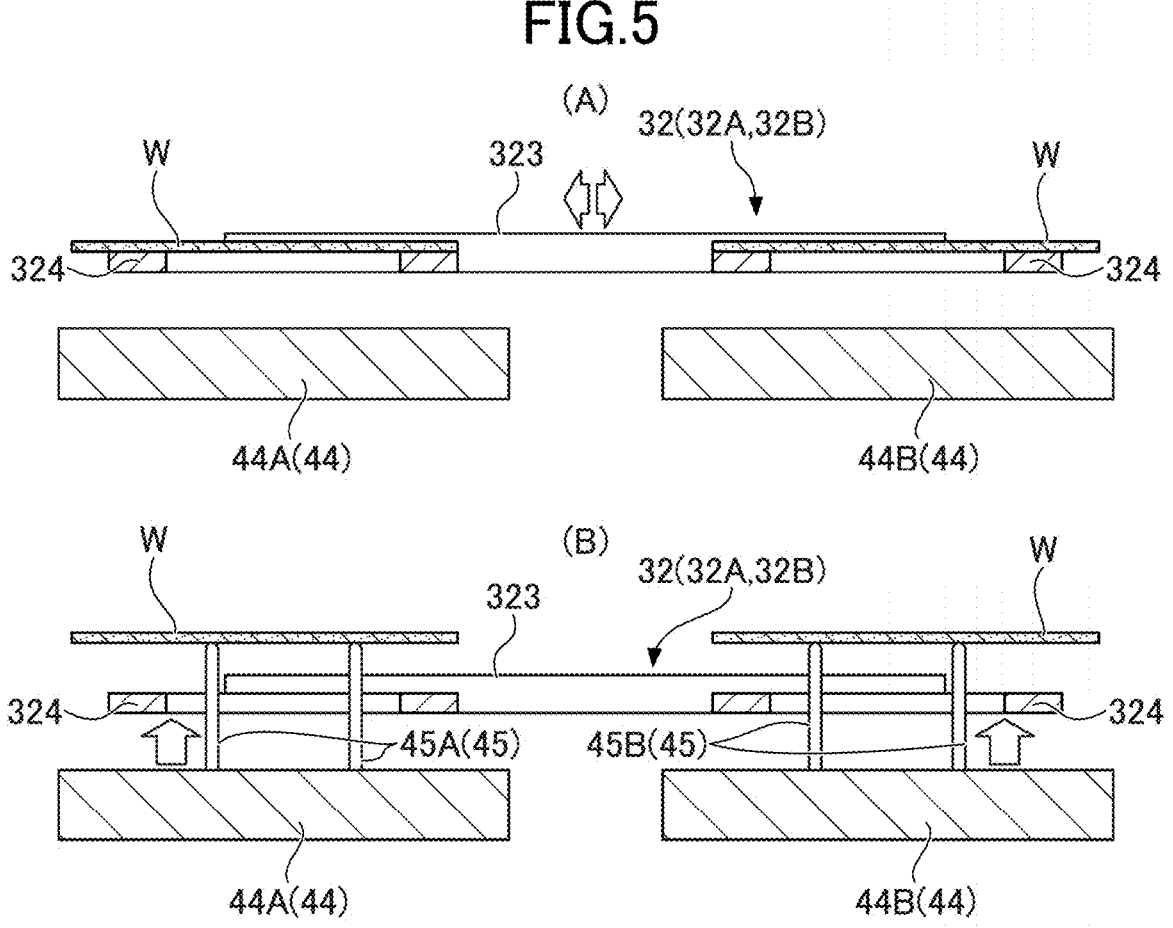
FIG. 5 is a cross-sectional view schematically illustrating an operation of average correction by the transfer robot.

That is, the wafer W is delivered to the first stage 44A in the pass module PASM. The number of the lift pins 45 in each stage 44 is not particularly limited as long as there are three or more lift pins 45, and FIGS. 3 to 5 illustrate two lift pins 45 for convenience of illustration.

Next, as illustrated in FIG. 3 (C), the control device 80 moves the first end effector 323 of the transfer robot 32 in the horizontal direction while maintaining the state in which the wafer W is raised in the first stage 44A, and positions the wafer W to be placed with respect to the second stage 44B. Accordingly, the center of the second stage 44B coincides with the center of the wafer W, and the corrected state is achieved. At this time, the wafer W held by the first lift pins 45A in the first stage 44A does not move in the horizontal direction. Therefore, the positional deviation of the wafer W is corrected in both the first stage 44A and the second stage 44B.

As illustrated in FIG. 3 (D), the control device 80 raises the plurality of lift pins 45 (the second lift pins 45B) housed in the second stage 44B, and raises the wafer W above the first fork 324. Accordingly, the wafer W is delivered to the second stage 44B in the pass module PASM. Thereafter, the control device 80 retracts the transfer robot 32 from the pass module PASM, and then lowers the first lift pins 45A and the second lift pins 45B, thereby placing the respective wafers W on the first stage 44A and the second stage 44B. Each wafer W is supported by each stage 44 in a state in which the position thereof is accurately corrected with respect to the corresponding stage 44.

Note that the one-by-one correction is not limited to the method illustrated in FIG. 3, and the positions of a plurality of wafers W can be individually corrected by another procedure. For example, as illustrated in FIG. 4, in the one-by-one correction, the positional deviation of each wafer W can be corrected by providing a step between the first lift pins 45A and the second lift pins 45B.

Specifically, as illustrated in FIG. 4 (A), the first end effector 323 is moved horizontally so that the center of the wafer W on the side where the lift pins 45 largely protrude from the stage 44 (the first stage 44A) coincides with the center of the stage 44. Accordingly, while the center of the first stage 44A coincides with the center of the wafer W in a corrected state, the center of the second stage 44B largely deviates from the position of the center of the second stage 44B.

When the wafer W is in the corrected state, as illustrated in FIG. 4 (B), the control device 80 lowers the transfer robot 32 so that the wafer W is held by the first lift pin 45A and separated from the first fork 324. Accordingly, the wafer W is delivered to the first stage 44A in the pass module PASM.

Next, as illustrated in FIG. 4 (C), the control device 80 moves the first end effector 323 of the transfer robot 32 in the horizontal direction while maintaining the wafer W in a raised state in the first stage 44A, and positions the wafer W to be placed in the second stage 44B. Accordingly, the center of the second stage 44B coincides with the center of the wafer W, and the corrected state is achieved. At this time, the wafer W held by the first lift pins 45A in the first stage 44A does not move in the horizontal direction.

As illustrated in FIG. 4 (D), the control device 80 further lowers the transfer robot 32 to hold the wafer W on the second lift pins 45B, and separates the wafer W above the first fork 324. That is, the wafer W is delivered to the second stage 44B in the pass module PASM. Therefore, the control device 80 horizontally retracts the transfer robot 32 from the pass module PASM, and then lowers the first lift pins 45A and the second lift pins 45B to place the respective wafers W on the first stage 44A and the second stage 44B. Even in this case, the wafer W is supported by the corresponding stage 44 in a state in which the position of the wafer W is accurately corrected with respect to each stage 44.

Here, in the above-described one-by-one correction, a slide movement is performed for adjusting the horizontal position of each of the plurality of wafers W. For this reason, it takes time until the wafers W are placed on the stages 44 in the one-by-one correction. For this reason, in the correction processing, the semiconductor manufacturing system 1 can execute average correction in which the average value of the positions of the two wafers W is taken and the wafers W are placed on the stages 44 collectively (simultaneously) as illustrated in FIG. 5. In this case, the potential positional deviation of the wafers W with respect to the stages 44 is not eliminated, but the wafers W can be quickly placed on the stages 44.

Specifically, the control device 80 calculates an intermediate position between the position (e.g., center position) of the wafer W to be placed on the first stage 44A and the position (e.g., center position) of the wafer W to be placed on the second stage 44B. Then, as illustrated in FIG. 5 (A), the control device 80 moves the first end effector 323 in the horizontal direction so that the calculated intermediate position coincides with the intermediate position of the first stage 44A and the second stage 44B. Accordingly, the center of the wafer W is slightly deviated with respect to the center of the first stage 44A, and the center of the wafer W is deviated with respect to the center of the second stage 44B by the same amount. However, each of the wafers W is positionally deviated so as to be able to be placed on the respective stages 44.

Therefore, as illustrated in FIG. 5 (B), the control device 80 raises the lift pins 45 of the respective stages 44. When the lift pins 45 come into contact with the wafers W, the lift pins 45 simultaneously raise the wafers W from the pair of first forks 324. Accordingly, a wafer W is delivered to the first stage 44A and a wafer W is delivered to the second stage 44B in the pass module PASM. Therefore, the control device 80 retracts the transfer robot 32 from the pass module PASM in the horizontal direction, and then lowers the first lift pins 45A and the second lift pins 45B to place a wafer W on each of the first stage 44A and the second stage 44B. Accordingly, the wafers W are quickly disposed with respect to the stages 44.

As described above, the one-by-one correction and the average correction have advantages and disadvantages. While the one-by-one correction can accurately place the wafers W on the stages 44, it takes a long time for the operation at the time of placement. While the average correction shortens the time for placing the wafers W on the stages 44, the positional deviation of the wafers W with respect to the stages 44 potentially remains.

Figure 6:
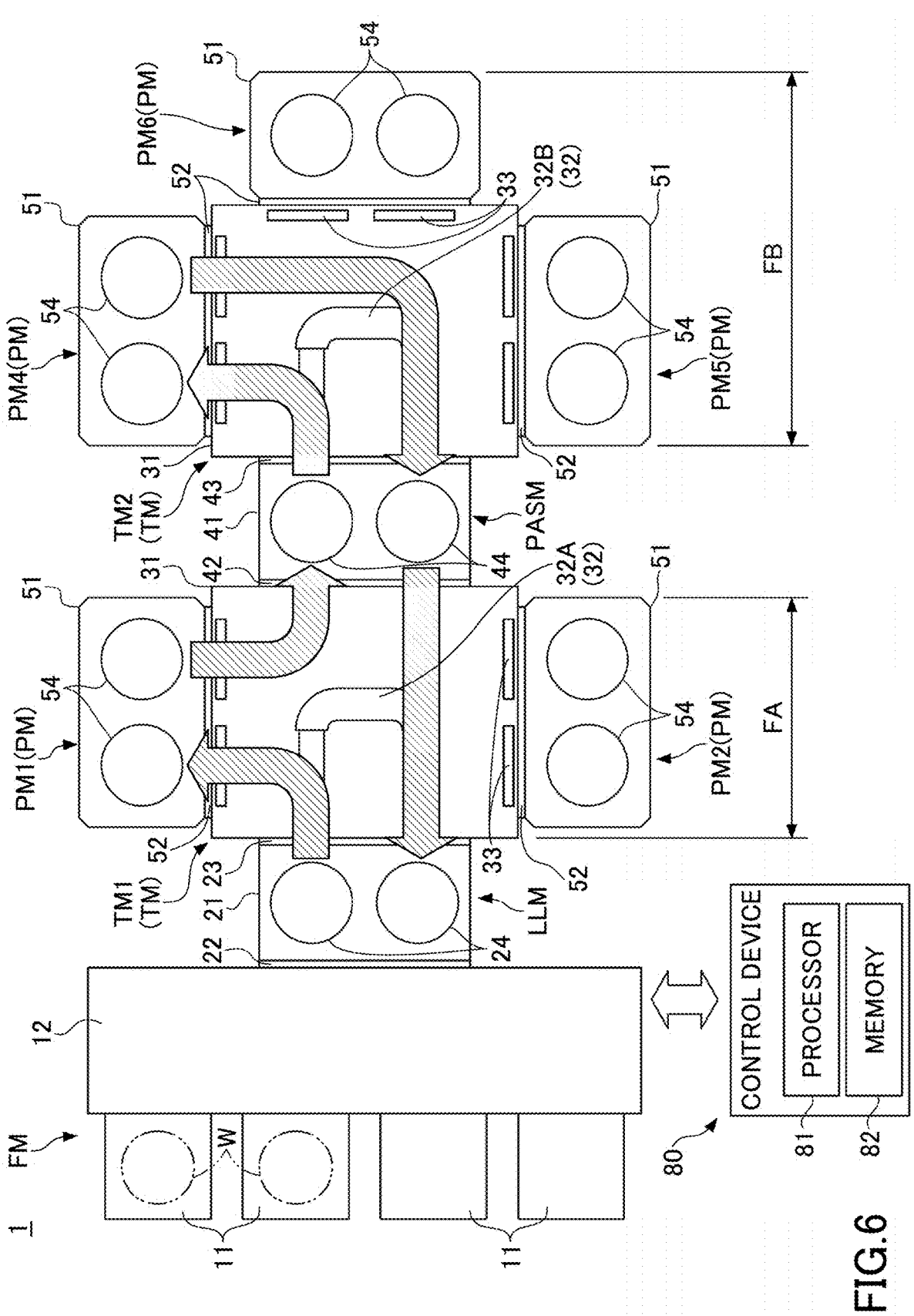
FIG. 6 is a plan view illustrating a transfer path during first and second substrate processing.

In the semiconductor manufacturing system 1 illustrated in FIG. 1, as described above, substrate processing is performed twice in the front-side processing region FA and the back-side processing region FB. While the wafer W is carried out from the load-lock module LLM, subjected to substrate processing at two process modules PM, and returned to the load-lock module LLM, the operation of placing each wafer W on various modules is performed a plurality of times. An example of a transfer path of each wafer when the wafer W is subjected to substrate processing in the semiconductor manufacturing system 1 will be described with reference to FIG. 6. FIG. 6 is a plan view illustrating a transfer path of two wafers W in the semiconductor manufacturing system 1.

When the wafer W is subjected to substrate processing in the semiconductor manufacturing system 1, the wafer W is taken out from the FOUP set in the load port 11 of the front module FM by an atmospheric transfer device in the loader 12, and the wafer W is placed on each stage 24 of the load-lock module LLM. Further, the semiconductor manufacturing system 1 depressurizes the inside of the load-lock container 21 from an atmospheric atmosphere to a vacuum atmosphere. After depressurization, the semiconductor manufacturing system 1 takes out the unprocessed wafers W from the load-lock container 21 by the first transfer robot 32A of the first transfer module TM1.

Before the first substrate processing, the first transfer robot 32A carries the unprocessed wafer W taken out from the load-lock module LLM into, for example, the first process module PM1 through the transfer container 31 of the first transfer module TM1. In this carrying in, the first transfer robot 32A places the wafers W on the respective stages 54 of the first process module PM1. After the placement, the first process module PM1 performs first substrate processing on each unprocessed wafer W.

When the first substrate processing is ended, the semiconductor manufacturing system 1 carries out the wafer W that has undergone the first substrate processing from the first process module PM1 by the first transfer robot 32A and carries the wafer W into the pass module PASM through the first transfer module TM1. In this carrying in, the first transfer robot 32A places each wafer W on each stage 44 of the pass module PASM.

After this placement, the semiconductor manufacturing system 1 carries out the wafer W that has undergone the first substrate processing from the pass module PASM by the second transfer robot 32B and carries the wafer W into the fourth process module PM4 through the second transfer module TM2. In this carrying in, the second transfer robot 32B places each wafer W on a corresponding stage 54 of the fourth process module PM4. After the placement, the fourth process module PM4 carries out the second substrate processing on each wafer W that has undergone the first substrate processing.

After the second substrate processing, the semiconductor manufacturing system 1 carries out each wafer W that has undergone the second substrate processing from the second transfer module TM2 by the second transfer robot 32B and carries the wafer W into the pass module PASM through the second transfer module TM2. In this carrying in, the second transfer robot 32B places the wafers W on the respective stages 44 of the pass module PASM. Further, in the semiconductor manufacturing system 1, the wafer W that has undergone the second substrate processing is carried out from the pass module PASM by the first transfer robot 32A, and is carried into the load-lock module LLM through the first transfer module TM1. In this carrying in, the first transfer robot 32A places the wafers W on the respective stages 24 of the load-lock module LLM.

In FIG. 6, the first substrate processing is performed by the first process module PM1, and the second substrate processing is performed by the fourth process module PM4. The semiconductor manufacturing system 1 is not limited to this procedure, as a matter of course. As the process modules PM for the first substrate processing and the second substrate processing, there are a plurality of patterns as illustrated in the table illustrated in FIG. 7. That is, the second process module PM2 can be used in place of the first process module PM1, and the fifth process module PM5 and the sixth process module PM6 can be used in place of the fourth process module PM4.

In the table of FIG. 7, reference numerals 1-1 to 1-6 denote patterns in which the first substrate processing is performed in the front-side processing region FA and the second substrate processing is performed in the back-side processing region FB. In this case, after the first substrate processing in the front-side processing region FA, the semiconductor manufacturing system 1 transfers the wafer W to the first transfer module TM1, the pass module PASM, and the second transfer module TM2 in this order, and performs the second substrate processing in the back-side processing region FB.

In the table of FIG. 7, reference numerals 2-1 to 2-6 denote patterns in which the first substrate processing is performed in the back-side processing region FB and the second substrate processing is performed in the front-side processing region FA. In this case, after the first substrate processing in the back-side processing region FB, the semiconductor manufacturing system 1 transfers the wafer W to the second transfer module TM2, the pass module PASM, and the first transfer module TM1 in this order, and performs the second substrate processing in the front-side processing region FA.

The positional deviation of each wafer W occurs when the substrate processing (first and second substrate processing) is performed. For example, in the first substrate processing, the wafer W placed on the stage 54 may be positionally deviated in the horizontal direction with respect to the placing surface of the stage 54 due to the influence of heat or air flow during the substrate processing.

If the wafer W that has undergone the first substrate processing is transferred to another process module PM and the second substrate processing is performed with the positional deviation still occurring, there is a possibility that inconveniences such as unevenness or the like may occur during the processing, resulting in poor substrate processing, or the wafer W may be further positionally deviated and cannot be collected. Therefore, when the wafer W is positionally deviated in the first substrate processing, the semiconductor manufacturing system 1 performs correction processing corresponding to the positional deviation of the wafer W during the transfer between the first substrate processing and the second substrate processing. In particular, the semiconductor manufacturing system 1 can eliminate the positional deviation of each wafer W by performing one-by-one correction, and can accurately place each wafer W on each stage 54 of the process module PM for performing the second substrate processing. Accordingly, the semiconductor manufacturing system 1 can satisfactorily perform the second substrate processing and prevent the positional deviation of the wafer W in the second substrate processing.

However, as illustrated in FIG. 7, during the transfer between the first substrate processing and the second substrate processing, there are an operation of placing each wafer W on the pass module PASM and an operation of carrying out each wafer W from the pass module PASM and placing each wafer W on a predetermined process module PM. The semiconductor manufacturing system 1 can achieve both efficient transfer of each wafer W and accurate placing of each wafer W on a corresponding stage 54 by performing the one-by-one correction only once among the two operations. For example, in the patterns of 1-1 to 1-6 in FIG. 7, the one-by-one correction is performed when the first transfer robot 32A places each wafer W on the pass module PASM and when the second transfer robot 32B places each wafer W on a corresponding process module PM in the back-side processing region FB. In the patterns of 2-1 to 2-6 in FIG. 7, the one-by-one correction is performed when the second transfer robot 32B places each wafer W on the pass module PASM and when the first transfer robot 32A in the front-side processing region FA places each wafer W on a corresponding process module PM.

Figure 8:
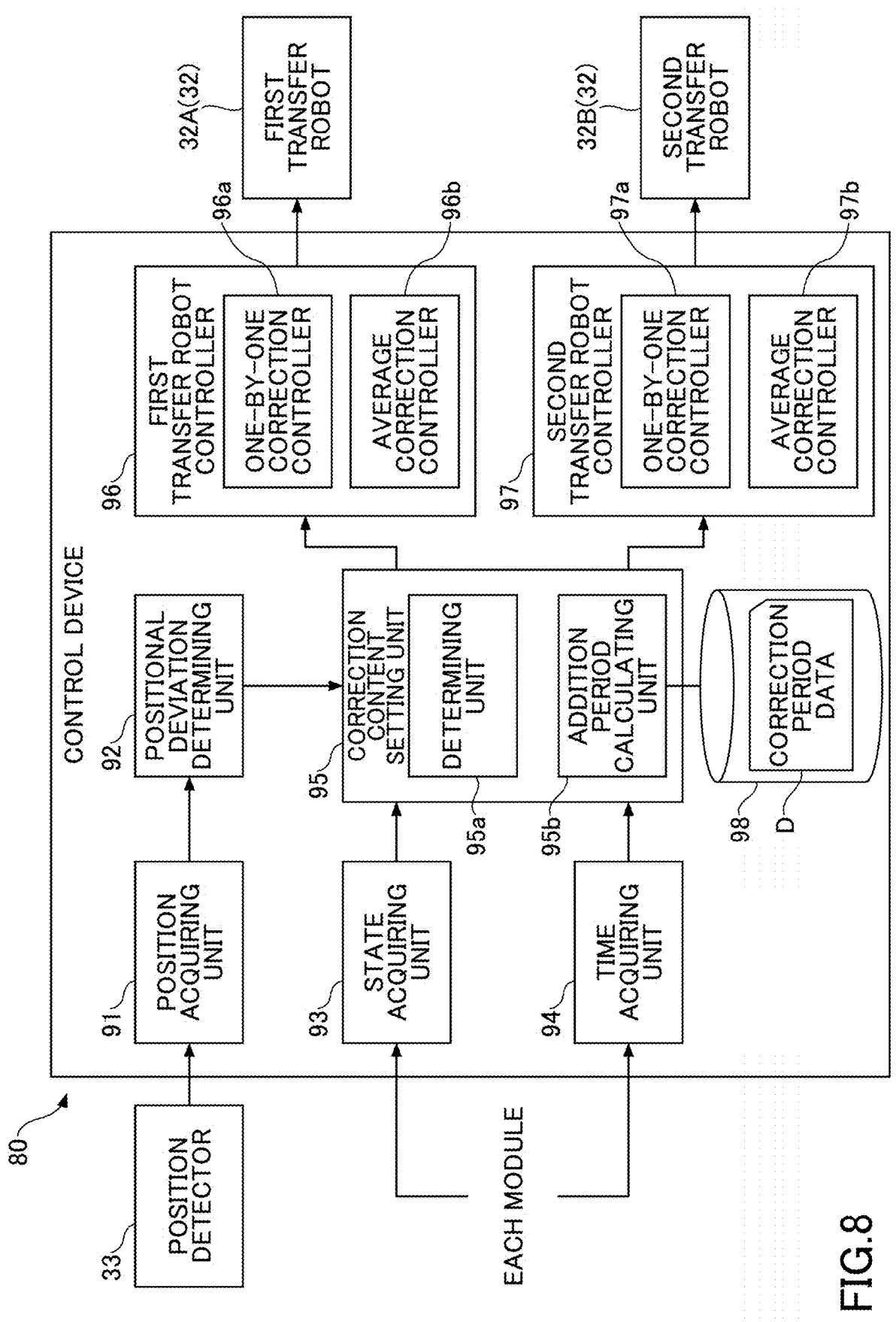
FIG. 8 is a block diagram illustrating functional units of a control device for transferring a substrate between first substrate processing and second substrate processing.

The control device 80 performs control for performing the one-by-one correction at an appropriate timing in the transfer between the first substrate processing and the second substrate processing. Therefore, by executing a program in the memory 82 by the processor 81, functional blocks for properly transferring the wafer W are constructed in the control device 80 as illustrated in FIG. 8.

For example, a position acquiring unit 91, a positional deviation determining unit 92, a state acquiring unit 93, a time acquiring unit 94, a correction content setting unit 95, a first transfer robot controller 96, and a second transfer robot controller 97 are formed in the control device 80.

The position acquiring unit 91 acquires position detection information of the wafer W detected by each position detector 33 of the transfer module TM when the transfer robot 32 carries out each wafer from the process module PM. The position acquiring unit 91 stores the position detection information in the memory 82 and outputs the position detection information to the positional deviation determining unit 92.

The positional deviation determining unit 92 determines the positional deviation of each wafer w with respect to the transfer robot 32 based on the position detection information acquired by the position acquiring unit 91. For example, the positional deviation determining unit 92 has a threshold value for determining the amount of positional deviation obtained by subtracting reference position information from the position detection information, and determines that a positional deviation has occurred in the wafer W when the amount of positional deviation is greater than or equal to the threshold value, and determines that a positional deviation has not occurred in the wafer W when the amount of positional deviation is less than the threshold value.

As described above, the positional deviation of the wafer W is caused by substrate processing in each process module PM. Therefore, the positional deviation determining unit 92 determines the positional deviation of each wafer W when the wafer W that has undergone substrate processing is taken out from the process module PM. Then, when the positional deviation has occurred in either of the wafers W, the positional deviation determining unit 92 determines that correction processing is necessary during the transfer between the first substrate processing and the second substrate processing.

When performing the correction processing based on the determination by the positional deviation determining unit 92, the state acquiring unit 93 acquires the state information of the wafer W from each module (load-lock module LLM, pass module PASM, process module PM). For example, the state information of the wafer W includes whether or not the wafer W is housed in each module, whether or not each unprocessed wafer W is transferred in the case of the load-lock module LLM, and whether the wafer W is being subjected to substrate processing or the wafer W has been subjected to substrate processing in the case of the process module PM. The state acquiring unit 93 stores the acquired state information of the wafer W of each module in the memory 82 and outputs the acquired state information to the correction content setting unit 95.

The time acquiring unit 94 acquires the information of the remaining period of the substrate processing of the wafer W currently being performed from each process module PM. The remaining period of the substrate processing is used to determine the timing (including the execution location) at which the one-by-one correction is performed. The time acquiring unit 94 stores the acquired information of the remaining period of the substrate processing of each process module PM in the memory 82 and outputs the acquired information to the correction content setting unit 95.

The correction content setting unit 95 determines the timing for performing the one-by-one correction when performing the correction processing, and sets the operation content for the first transfer robot 32A and the second transfer robot 32B between the first substrate processing and the second substrate processing. For example, the correction content setting unit 95 internally includes a determining unit 95a and an addition period calculating unit 95b.

The determining unit 95a determines the timing for performing the one-by-one correction based on the state information of the wafer W of each module acquired by the state acquiring unit 93 and the remaining period of the substrate processing of each process module PM acquired by the time acquiring unit 94. In this determination, the addition period calculating unit 95b calculates the addition period by adding a plurality of periods necessary for the determination by the determining unit 95a. The processing of the determining unit 95a and the addition period calculating unit 95b will be described in detail later in the description of the processing flow.

The first transfer robot controller 96 controls the operation of the first transfer robot 32A. The first transfer robot controller 96 has a one-by-one correction controller 96a for controlling the one-by-one correction and an average correction controller 96b for controlling the operation of the average correction.

The second transfer robot controller 97 controls the operation of the second transfer robot 32B. The second transfer robot controller 97 also includes the one-by-one correction controller 97a for controlling the one-by-one correction and the average correction controller 97b for controlling the operation of the average correction.

The semiconductor manufacturing system 1 according to the present embodiment is basically configured as described above, and the operation (substrate transfer method) will be described below. Hereinafter, an example will be given of a case where two wafers W are transferred along the transfer path illustrated in FIG. 6.

Before the first substrate processing, the control device 80 of the semiconductor manufacturing system 1 transfers the two wafers W from the load-lock module LLM to the first process module PM1 by controlling the operation of the first transfer module TM1 as described above. After this transfer, the semiconductor manufacturing system 1 performs the first substrate processing in the first process module PM1.

The control device 80 performs the processing flow of the substrate transfer method illustrated in FIG. 9 to transfer the two wafers W between the first substrate processing and the second substrate processing. Specifically, in the first substrate processing, the control device 80 continuously acquires the state information of the first process module PM1 and the remaining period of the first substrate processing by the state acquiring unit 93 and the time acquiring unit 94. When the end of the first substrate processing approaches, the control device 80 operates the first transfer robot 32A under the control of the first transfer robot controller 96 to take out the two unprocessed wafers W to be processed next from the load-lock module LLM (step S1).

After the first substrate processing in the first process module PM1 is ended, the control device 80 receives the two wafers W that have undergone the first substrate processing in the first process module PM1 by causing the first transfer robot 32A and the first process module PM1 to operate in cooperation (step S2).

Then, the first transfer robot controller 96 operates the first transfer robot 32A to carry out the wafers W that have undergone the first substrate processing into the first transfer module TM1 (step S3). The control device 80 operates the first transfer robot 32A and the first process module PM1 to transfer the unprocessed wafers W taken out in step S1 into the first process module PM1 and deliver the unprocessed wafers W to the respective stages 54. Then, the first process module PM1 starts substrate processing for the unprocessed wafers W placed on the respective stages 54.

While the wafers W that have undergone the first substrate processing are taken out, the semiconductor manufacturing system 1 detects the position of the wafers W with respect to the first transfer robot 32A by the position detector 33 of the first transfer module TM1. At this time, the position acquiring unit 91 of the control device 80 acquires the position detection information of the position detector 33, and determines whether or not one or both of the wafers W are positionally deviated from the first transfer robot 32A (e.g., the first fork 324) by a predetermined amount or more (step S4). Then, when at least one of the wafers W is positionally deviated (step S4: YES), the control device 80 determines that correction processing for correcting the positional deviation of the wafers w is to be performed, and the process proceeds to step S5. On the other hand, when both of the wafers W are not positionally deviated (step S4: NO), the control device 80 determines that correction processing for the positional deviation is not to be performed, and the process proceeds to step S6 without performing step S5.

When the correction processing for the positional deviation is to be performed, the control device 80 executes a correction determination method for determining the timing and the place for performing the one-by-one correction during the transfer of the wafers W that have undergone the first substrate processing (step S5).

Figure 10:
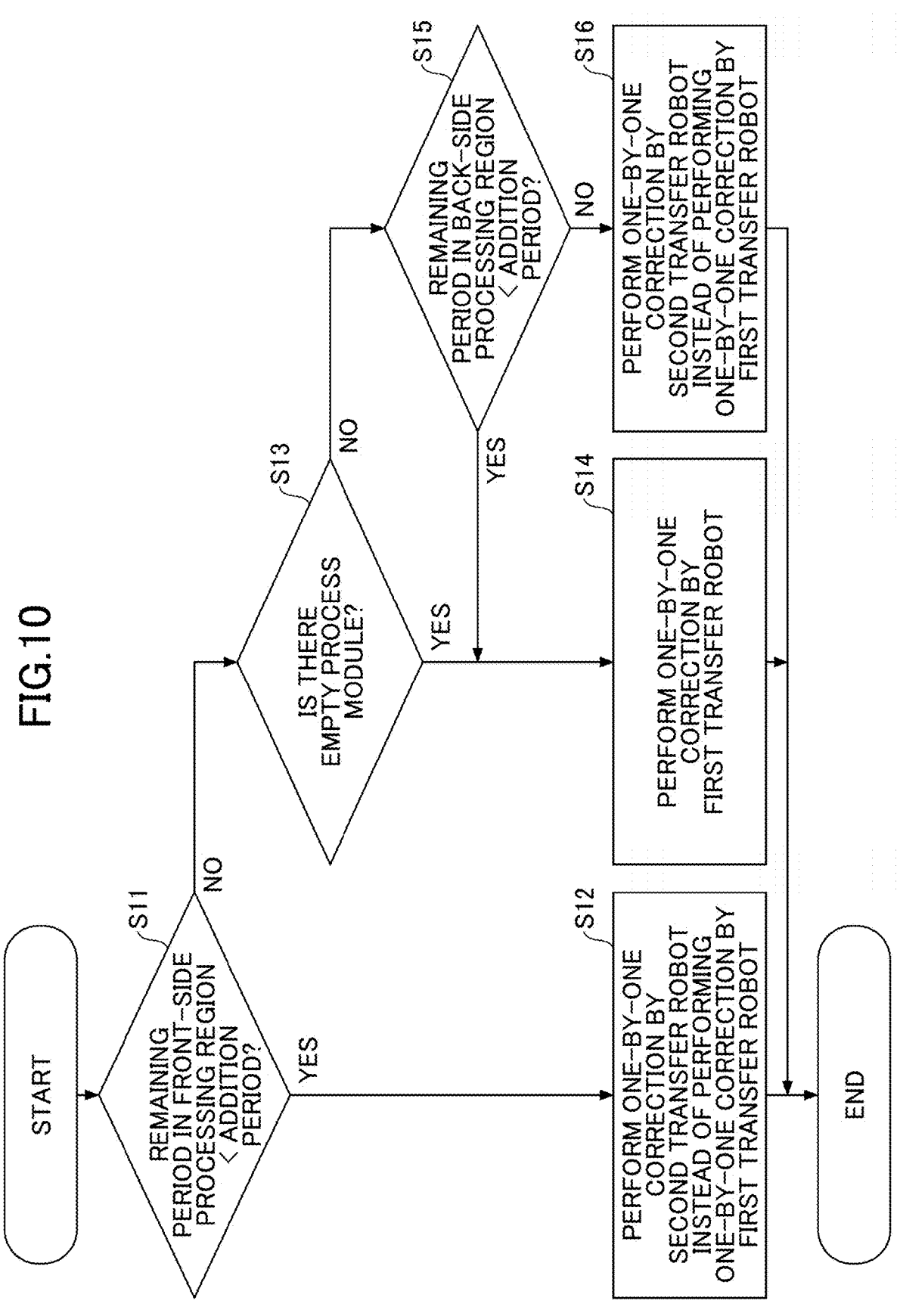
FIG. 10 is a flowchart illustrating the correction determination processing method of FIG. 9.

In the correction determination method, the control device 80 first checks the status of the front-side processing region FA. Specifically, as illustrated in FIG. 10, the correction content setting unit 95 compares the remaining period until the end of the substrate processing being performed by the second process module PM2 in the front-side processing region FA with the addition period for the plurality of operations performed by the first transfer robot 32A (step S11). The period for the plurality of operations includes a PAS placement period, a return period, and a take-out period. The "PAS placement period" is a period for the first transfer robot 32A to place each wafer w that has undergone the first substrate processing on the pass module PASM. The "return period" is a period required to return each wafer W that has undergone the second substrate processing in the pass module PASM to the load-lock module LLM. If there is no wafer W in the pass module PASM, the return period is 0. The "take-out period" is a period required to take out each unprocessed wafer W from the load-lock module LLM and transfer the wafer W to the second process module PM2. The addition period calculating unit 95b of the correction content setting unit 95 calculates an addition period obtained by adding all the PAS placement period, return period, and take-out period.

At this time, the addition period calculating unit 95b calculates an addition period obtained by adding the PAS placement period when the first transfer robot 32A executes the one-by-one correction in the pass module PASM. Specifically, the control device 80 stores correction period data D (=PAS placement period), which is the length of time when the one-by-one correction is performed in advance, in the correction storage area 98 of the memory 82. When calculating the addition period, the addition period calculating unit 95b reads the correction period data D in the correction storage area 98 and uses the correction period data D as the PAS placement period.

The determining unit 95a compares the above remaining period with the calculated addition period, and determines whether or not there is a margin for the one-by-one correction in the front-side processing region FA. Then, when the remaining period is shorter than the addition period (YES in step S11), the determining unit 95a determines that the first transfer robot 32A does not perform the one-by-one correction when each wafer w is placed on the pass module PASM (step S12). That is, when the remaining period is shorter than the addition period, it can be said that there is a situation where there is not much time (no margin) in the front-side processing region FA because the wafer W of the next substrate processing in the front-side processing region FA is ended earlier.

In this case, the correction content setting unit 95 instructs the first transfer robot controller 96 to perform the average correction. Thus, the first transfer robot controller 96 performs the average correction when each wafer W is placed on the pass module PASM by the first transfer robot 32A. Then, the correction content setting unit 95 instructs the second transfer robot controller 97 to perform the one-by-one correction. Accordingly, the second transfer robot controller 97 performs the one-by-one correction when each wafer W is placed on any of the fourth to sixth process modules PM4, PM5, and PM6 by the second transfer robot 32B.

On the other hand, when the remaining period is equal to or longer than the addition period (NO at step S11), it can be regarded that there is a margin for performing the one-by-one correction when each wafer W is placed on the pass module PASM from the first transfer module TM1. Therefore, the correction content setting unit 95 next checks the status of the second transfer module TM2 based on the state information acquired by the state acquiring unit 93. First, the determining unit 95a determines whether or not there is an empty process module PM among the fourth to sixth process modules PM4, PM5, and PM6 in which substrate processing of each wafer W has not been performed (step S13). When there is an empty process module PM among the fourth to sixth process modules PM4, PM5, and PM6 (step S13: YES), the process proceeds to step S14, and when there is no empty process module PM (step S13: NO), the process proceeds to step S15. A state where there is an empty process module PM among the fourth to sixth process modules PM4, PM5, and PM6, includes a state in which each wafer W subjected to substrate processing can be taken out from the module. Thus, it is possible to prevent each wafer W that has undergone substrate processing from staying in the process module PM for a long time.

In step S14, the determining unit 95a determines that the first transfer robot 32A performs one-by-one correction when each wafer W is placed on the pass module PASM. That is, when there is an empty process module PM, the rate of the empty process module PM is determined regardless of whether the first transfer module TM1 or the second transfer module TM2 performs one-by-one correction. Therefore, the one-by-one correction is performed in the first transfer module TM1 which is determined to have a margin.

On the other hand, when there is no margin in the fourth to sixth process modules PM4, PM5, and PM6, another determination is performed in step S15. Specifically, the correction content setting unit 95 compares the remaining period (redetermined remaining period) of the substrate processing of the process module PM for which the substrate processing ends earliest among the process modules PM in the back-side processing region FB with the addition period (redetermined addition period) for the operation of the first transfer robot 32A and the operation of the second transfer robot 32B. The operation period of the first transfer robot 32A includes a first PAS placement period for placing the wafer W that has undergone the first substrate processing held by the first transfer robot 32A on the pass module PASM. The operation period of the second transfer robot 32B includes a second PAS placement period for placing the wafers W previously held by the second transfer robot 32B on the pass module PASM, and a transfer period for transferring the wafer W that has undergone the first substrate processing placed on the pass module PASM by the second transfer robot 32B. If there is no wafer W at the second transfer robot 32B, the second PAS placement period is zero.

The addition period calculating unit 95*b* calculates a redetermined addition period obtained by adding the first PAS placement period, the second PAS placement period, and the transfer period when the first transfer robot 32A executes the one-by-one correction in the pass module PASM. The determining unit 95*a* compares the redetermined remaining period of the process module PM performing the earliest substrate processing with the calculated redetermined addition period. If the redetermined remaining period is shorter than the redetermined addition period (YES at step S15), the determining unit 95*a* proceeds to step S14 and determines that the first transfer robot 32A performs the one-by-one correction when the wafers W are placed in the pass module PASM. If the redetermined remaining period of the process module PM performing the earliest substrate processing is shorter, the rate is determined regardless of whether the one-by-one correction is performed by the first transfer module TM1 or the second transfer module TM2. For this reason, the one-by-one correction is performed by the first transfer module TM1 which is determined to have a margin.

On the other hand, when the redetermined remaining period of the process module PM performing the earliest substrate processing is greater than or equal to the redetermined remaining period (NO at step S15), it is determined that the second transfer module TM2 performs the one-by-one correction (step S16). In this case, when the wafer W that has undergone the first substrate processing is placed on the process module PM in the back-side processing region FB with a small amount of work, the efficiency (throughput) of the entire apparatus is improved by performing the one-by-one correction. That is, the first transfer robot 32A selectively performs the transfer from the load-lock module LLM to each process module PM, the transfer from each process module PM to the pass module PASM, and the transfer from the pass module PASM to the load-lock module LLM. On the other hand, the second transfer robot 32B selectively performs the transfer from the pass module PASM to each process module PM, and the transfer from each process module PM to the pass module PASM. Therefore, in the semiconductor manufacturing system 1, when the amount of work of the first transfer robot 32A in the front-side processing region FA is compared with the amount of work of the second transfer robot 32B in the back-side processing region FB, the amount of work of the first transfer robot 32A is larger. Therefore, by performing the one-by-one correction in the back-side processing region FB where the amount of work is smaller, the first transfer robot 32A can easily shift to the next operation, thereby improving the efficiency of the entire system.

Returning to FIG. 9, when the above correction determination process (step S5) is performed, the first transfer robot controller 96 transfers each wafer W that has undergone the first substrate processing toward the pass module PASM in accordance with the determination contents in the correction determination process (step S6). In the case of the determination to perform the one-by-one correction in the first transfer module TM1, the first transfer robot controller 96 performs the one-by-one correction when the first transfer robot 32A places each wafer W on the pass module PASM. On the other hand, if it is determined that the first transfer module TM1 does not perform the one-by-one correction, the first transfer robot controller 96 performs the average correction when the first transfer robot 32A places each wafer W on the pass module PASM. If step S5 is skipped, the placing operation without performing the correction processing (substantially the same operation as the average correction) is performed.

Thereafter, the second transfer robot controller 97 transfers each wafer W that has undergone the first substrate processing placed on the pass module PASM toward the process module PM selected in the correction determination processing (step S7). At this time, if the one-by-one correction is performed by the first transfer module TM1, there is no positional deviation of each wafer W with respect to each stage 44. Therefore, when the second transfer module TM2 carries each wafer W that has undergone the first substrate processing into the process module PM, the control device 80 can place the wafer W on the stage 54 without performing the correction. At this time, the second transfer robot 32B can substantially perform the average correction and immediately place each wafer W on a corresponding stage 44.

On the other hand, when the average correction is performed by the first transfer module TM1, the control device 80 performs the one-by-one correction when the second transfer module TM2 carries each wafer W that has undergone the first substrate processing into the process module PM. Thus, the process module PM can satisfactorily perform the second substrate processing on each wafer W accurately placed on a corresponding stage 54.

Note that the substrate transfer method (including the correction determination method) according to the present embodiment is not limited to the above-described embodiment, and various embodiments may be adopted. For example, in the above-described substrate transfer method, the first substrate processing is performed in the front-side processing region FA and the second substrate processing is performed in the back-side processing region FB. However, in the substrate transfer method, the first substrate processing may be performed in the back-side processing region FB and the second substrate processing may be performed in the front-side processing region FA. Next, a substrate processing method according to another embodiment will be described with reference to FIGS. 11 and 12. Hereinafter, a case where the fourth process module PM4 in the back-side processing region FB is used for the first substrate processing will be exemplified.

In the first substrate processing, the control device 80 of the semiconductor manufacturing system 1 continuously acquires the state information of the fourth process module PM4 and the remaining period of the first substrate processing by the state acquiring unit 93 and the time acquiring unit 94. When the first substrate processing is nearing the end, the control device 80 operates the second transfer robot 32B under the control of the second transfer robot controller 97 to take out the two unprocessed wafers W to be processed next from the pass module PASM (step S21).

After the first substrate processing in the fourth process module PM4 is ended, the control device 80 receives the wafers W that have undergone the first substrate processing in the fourth process module PM4 by causing the second transfer robot 32B and the fourth process module PM4 to operate in cooperation (step S22).

Then, the second transfer robot controller 97 operates the second transfer robot 32B to carry out the wafers W that have undergone the first substrate processing into the second transfer module TM2 (step S23). The control device 80 also operates the second transfer robot 32B and the fourth process module PM4 to transfer the unprocessed wafers W taken out in step S21 into the fourth process module PM4 and deliver the unprocessed wafers W to the respective stages 54. Then, the fourth process module PM4 starts substrate processing for the unprocessed wafers W placed on the respective stages 54.

While the wafers W that have undergone the first substrate processing are being taken out, the semiconductor manufacturing system 1 detects the position of the wafers W with respect to the first transfer robot 32A by the position detector 33 of the second transfer module TM2. At this time, the position acquiring unit 91 of the control device 80 acquires the position detection information of the position detector 33 and determines whether or not one or both of the wafers W are positionally deviated by a predetermined amount or more from the second transfer robot 32B (step S24). Then, when at least one of the wafers W is positionally deviated (step S24: YES), the control device 80 determines that the correction processing for correcting the positional deviation of the wafers W is to be performed, and the process proceeds to step S25. On the other hand, when both of the wafers W are not positionally deviated (step S24: NO), the control device 80 determines that the correction processing for the positional deviation is not to be performed, skips step S25, and proceeds to step S26.

In the case of performing the positional deviation correction processing, the control device 80 executes a correction determination method for determining the timing and execution location of the one-by-one correction, while each wafer W that has undergone the first substrate processing is being transferred (step S25).

Figure 12:
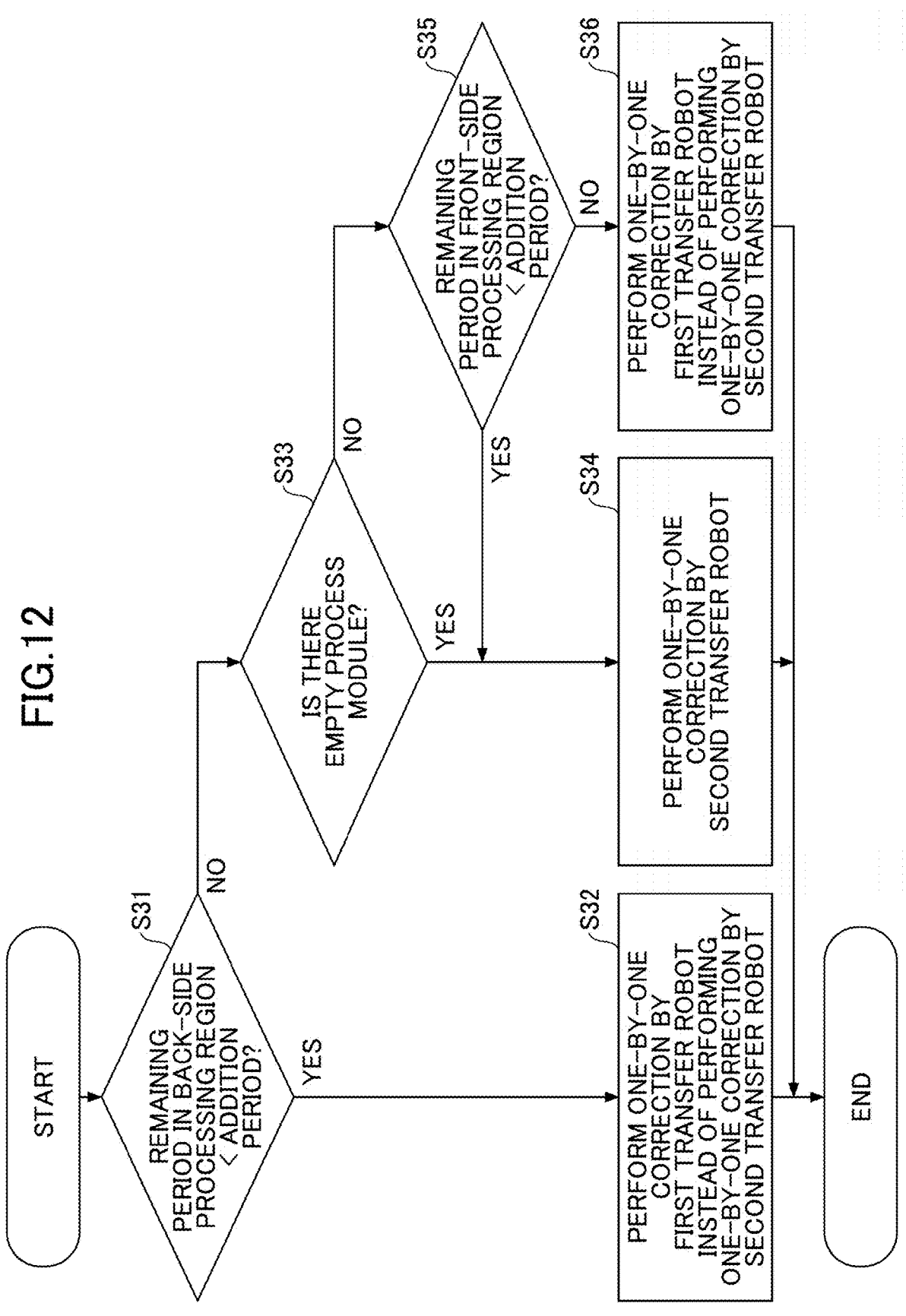
FIG. 12 is a flowchart illustrating the correction determination processing method of FIG. 11.

As illustrated in FIG. 12, in the correction determination method, the correction content setting unit 95 first checks the status of the back-side processing region FB. The correction content setting unit 95 compares the remaining period of the process module PM for which the substrate processing is ended earliest among the fifth process module PM5 and the sixth process module PM6 with the addition period required for a plurality of operations performed by the second transfer robot 32B (step S31). The plurality of operations include a PAS placement period and a take-out period. The "PAS placement period" is the time required until each wafer W that has undergone the first substrate processing held by the second transfer robot 32B is placed on the pass module PASM. The "take-out period" is the time required until each unprocessed wafer W is taken out of the pass module PASM and transferred to the fifth process module PM5 or the sixth process module PM6. When there is no wafer W in the pass module PASM, the take-out period is zero. The addition period calculating unit 95b of the correction content setting unit 95 calculates an addition period obtained by adding the entirety of the PAS placement period and the take-out period. At this time, the addition period calculating unit 95b reads the correction period data D (=PAS placement period) stored in the correction storage area 98, and calculates an addition period obtained by adding the PAS placement period when the second transfer robot 32B executes the one-by-one correction in the pass module PASM.

The determining unit 95a compares the above remaining period with the calculated addition period, and determines whether or not there is a margin for one-by-one correction in the back-side processing region FB. When the comparison results in the remaining period being shorter than the addition period (YES at step S31), the determining unit 95a determines that the one-by-one correction is not performed when the second transfer robot 32B places each wafer W on the pass module PASM (step S32). That is, when the remaining period is shorter than the addition period, because the next substrate processing of the wafer W in the back-side processing region FB ends earlier, it can be said that there is a situation in which there is not much time (no margin) in the back-side processing region FB.

In this case, the correction content setting unit 95 instructs the second transfer robot controller 97 to perform average correction. Accordingly, the second transfer robot controller 97 performs average correction when the second transfer robot 32B places each wafer W on the pass module PASM. Then, the correction content setting unit 95 instructs the first transfer robot controller 96 to perform one-by-one correction. Accordingly, the first transfer robot controller 96 performs one-by-one correction when the first transfer robot 32A places each wafer W on either the first process module PM1 or the second process module PM2.

On the other hand, if the remaining period is equal to or longer than the addition period (step S31: NO), it can be assumed that there is a margin to execute the one-by-one correction when the wafer W is placed on the pass module PASM from the second transfer module TM2. For this reason, the correction content setting unit 95 next checks the status on the side of the second transfer module TM2 based on the state information acquired by the state acquiring unit 93. First, the determining unit 95a determines whether there is an empty process module PM that is not performing substrate processing on each wafer W in the first process module PM1 or the second process module PM2 (step S33). If there is an empty process module PM among the first process module PM1 and the second process module PM2 (step S33: YES), the process proceeds to step S34, and if there is no empty process module PM (step S33: NO), the process proceeds to step S35. A state where there is an empty process module PM among the first process module PM1 and the second process module PM2, includes a state in which each wafer W subjected to substrate processing can be taken out from the module. Thus, it is possible to prevent each wafer W that has undergone substrate processing from staying in the process module PM for a long time.

In step S34, the determining unit 95a determines that the second transfer robot 32B performs one-by-one correction when the wafers W are placed on the pass module PASM. That is, regardless of whether the one-by-one correction is performed by the first transfer module TM1 or the second transfer module TM2, the rate is determined for the empty process module PM. For this reason, in the second transfer module TM2, which is determined to have a margin, the one-by-one correction is performed.

On the other hand, if neither the first process module PM1 nor the second process module PM2 is empty, another determination is performed in step S35. Specifically, the correction content setting unit 95 compares the remaining period (redetermined remaining period) of the substrate processing of the process module PM, which ends the substrate processing earliest among the process modules PM in the front-side processing region FA, with the addition period (redetermined addition period) for the operation of the first transfer robot 32A and the operation of the second transfer robot 32B. The operation period of the second transfer robot 32B includes a PAS placement period for placing the wafer W that has undergone the first substrate processing held by the second transfer robot 32B on the pass module PASM. The operation period of the first transfer robot 32A includes a load-lock placement period for placing the wafers W previously held on the load-lock module LLM, and a transfer period for transferring the wafer W that has undergone the first substrate processing placed on the pass module PASM by the first transfer robot 32A. If there is no wafer W in the first transfer robot 32A, the load-lock placement period is zero. The addition period calculating unit 95b adds the PAS placement period when the second transfer robot 32B executes the one-by-one correction in the pass module PASM to the load-lock placement period and the transfer period to calculate the redetermined addition period.

In step S35, the determining unit 95a compares the redetermined remaining period of the process module PM in which the substrate processing is earliest with the redetermined addition period. If the redetermined remaining period is shorter than the redetermined addition period (step S35: YES), the determining unit 95a proceeds to step S34 and determines that the second transfer robot 32B performs the one-by-one correction when each wafer W is placed on the pass module PASM. If the remaining period of the process module PM performing the earliest substrate processing is shorter, the rate is determined regardless of whether the one-by-one correction is performed by the first transfer module TM1 or the second transfer module TM2. Therefore, the one-by-one correction is performed by the second transfer module TM2 that has been determined to have a margin.

On the other hand, when the redetermined remaining period of the process module PM performing the earliest substrate processing is greater than or equal to the redetermined addition period (step S35: NO), it is determined that the first transfer module TM1 performs the one-by-one correction (step S36). In this case, it is more efficient for the system to perform the one-by-one correction when the wafer W that has undergone the first substrate processing is placed on the process module PM.

Returning to FIG. 11, when the above correction determination processing (step S25) is performed, the second transfer robot controller 97 transfers the wafer W that has undergone the first substrate processing toward the pass module PASM in accordance with the determination contents in the correction determination processing (step S26). When it is determined that the second transfer module TM2 performs the one-by-one correction, the second transfer robot controller 97 performs the one-by-one correction when the second transfer robot 32B places each wafer W on the pass module PASM. On the other hand, when it is determined that the one-by-one correction is not performed by the second transfer module TM2, the second transfer robot controller 97 performs the average correction when the second transfer robot 32B places each wafer W on the pass module PASM. If step S25 is skipped, the placing operation without performing the correction processing (substantially the same operation as the average correction) is performed.

Thereafter, the second transfer robot controller 97 transfers each wafer W that has undergone the first substrate processing, which is placed on the pass module PASM, toward the process module PM selected in the correction determination processing (step S27). At this time, when the second transfer module TM2 performs the one-by-one correction, no positional deviation occurs in each wafer W with respect to a corresponding stage 44. Therefore, when the first transfer module TM1 carries each wafer W that has undergone the first substrate processing into the process module PM, the control device 80 can place the wafer W on the stage 54 without performing the correction. At this time, the first transfer robot 32A substantially performs the average correction and can immediately place each wafer W on a corresponding stage 44.

On the other hand, when the second transfer module TM2 performs the average correction, the control device 80 performs the one-by-one correction when the first transfer module TM1 carries each wafer W that has undergone the first substrate processing into the process module PM. Thus, the process module PM can satisfactorily perform the second substrate processing on each wafer W accurately placed on a corresponding stage 54.

Note that the semiconductor manufacturing system 1 is not limited to the above embodiment, and various modifications can be made. For example, although the semiconductor manufacturing system 1 having two processing regions and two transfer modules TM has been described in the above embodiment, the semiconductor manufacturing system 1 may have a configuration having three or more processing regions and three or more transfer modules TM. Even in this case, by performing the same determination as in the above substrate transfer method, the substrate transfer efficiency can be improved and the substrate placement accuracy can be improved appropriately. For example, although the semiconductor manufacturing system 1 has a configuration having a plurality of process modules PM in each processing region described above, the semiconductor manufacturing system 1 may have a configuration having a single process module PM.

When the wafers W carried out from the process module PM are positionally deviated after the second substrate processing, the semiconductor manufacturing system 1 may perform one-by-one correction or average correction when the wafers W are placed on the stages 24 of the load-lock module LLM.

The technical concepts and effects of the present disclosure described in the above embodiments will be described below.

A first aspect of the present disclosure is a substrate transfer method for transferring a plurality of substrates (wafers W), the substrate transfer method involving a plurality of transfer modules TM provided with a transfer robot 32 configured to transfer the plurality of substrates;

a pass module PASM arranged between the plurality of transfer modules TM; and one or more process modules PM connected to the plurality of transfer modules TM, the one or more process modules PM being configured to perform substrate processing on the plurality of substrates transferred by a corresponding transfer module of the plurality of transfer modules TM, the substrate transfer method including:

in a case where the substrate is transferred from one of the plurality of transfer modules TM to the process module PM connected to another one of the plurality of transfer modules TM via the pass module PASM by controlling the transfer robot 32, when the plurality of substrates are carried into the pass module PASM, making a determination as to whether to perform one-by-one correction in which the plurality of substrates are placed on a plurality of stages 44 of the pass module PASM upon correcting positions of the plurality of substrates on a one-by-one basis or to perform average correction in which the plurality of substrates are placed on the plurality of stages 44 collectively upon taking an average value of the positions of the plurality of substrates.

In the above substrate transfer method, when a plurality of substrates (wafers W) are transferred to a plurality of transfer modules TM and a process module PM via a pass module PASM, it is possible to perform one-by-one correction for correcting the positions of the plurality of substrates on a one-by-one basis at appropriate timing. Therefore, the substrate processing method can enhance the accuracy of placing the substrates on the stages (44, 54) while improving the substrate transfer efficiency.

Further, the determination as to whether to perform the one-by-one correction or the average correction is made by comparing a remaining period until the process module PM ends the substrate processing for the transfer module TM having the transfer robot 32 holding the substrate (wafer W), with an addition period obtained by adding periods required for a plurality of operations of the transfer robot 32 including a period during which the transfer robot 32 holding the substrate performs the one-by-one correction and places the substrate on the pass module PASM;

when the remaining period is shorter than the addition period, determining that there is no margin for the one-by-one correction by the transfer robot 32 holding the substrate; and when the remaining period is greater than or equal to the addition period, determining that there is a margin for the one-by-one correction by the transfer robot 32 holding the substrate.

Accordingly, the substrate transfer method can determine the margin of the transfer module TM in which the substrate exists, and can satisfactorily determine whether to perform the one-by-one correction or the average correction according to the determined margin.

Further, the period for the plurality of operations of the transfer robot 32 includes a period for the transfer robot 32 holding the substrate (wafer W) to perform the one-by-one correction and place the substrate on the pass module PASM, a period for transferring the substrate in the pass module PASM to another module, and a period for transferring the substrate in the other module (load lock module LLM) to the process module PM. Accordingly, the substrate transfer method can make the determination taking into consideration the period of the operation performed by the transfer robot 32 in the transfer module TM in which the transfer robot 32 holding the substrate exists, and can accurately determine the margin of the transfer module TM.

Further, the substrate transfer method further includes:

making a setting to perform the average correction when placing the plurality of substrates on the pass module PASM in a case of determining that there is no margin for the one-by-one correction by the transfer robot 32 holding the substrate (wafer W), and to perform the one-by-one correction when placing the plurality of substrates inside the process module PM of the transfer module TM to which the substrate is transferred next via the pass module PASM. Accordingly, the transfer robot 32 holding the substrate can place the substrate on the pass module PASM in a short time. Therefore, the transfer module TM can efficiently shift to the next operation.

Further, the substrate transfer method further includes:

in a case of determining that there is a margin for the one-by-one correction by the transfer robot 32 holding the substrate (wafer W), further determining whether there is an empty module in one or more of the process modules PM connected to the transfer module TM to which the substrate is transferred next via the pass module PASM.

Accordingly, the substrate transfer method can select the timing of the one-by-one correction during the transfer of the substrate in detail according to the status of the process module PM of the transfer module TM to which the substrate is transferred next.

Further, the substrate transfer method further includes:

making a setting to perform the one-by-one correction when placing the plurality of substrates (wafer W) on the pass module PASM in a case where there is an empty module in one or more of the process modules PM.

Accordingly, the substrate processing method can correct the positional deviation of the substrate before the transfer module TM to which the substrate is transferred next, and can accurately place the substrate in a short time during the subsequent transfer to the process module PM.

Further, the substrate transfer method further includes:

when there is no empty module in one or more of the process modules PM, comparing a redetermined remaining period of substrate processing of one or more of the process modules PM connected to the transfer module TM to which the substrate is transferred next via the pass module PASM, with a redetermined addition period obtained by adding a period during which the transfer robot 32 holding the substrate (wafer W) performs the one-by-one correction and places the substrate on the pass module PASM to a period during which a plurality of operations of the transfer module TM to which the substrate is transferred next are performed;

when the redetermined remaining period is shorter than the redetermined addition period, determining to perform the one-by-one correction by the transfer robot 32 holding the substrate; and when the redetermined remaining period is greater than or equal to the redetermined addition period, determining to perform the average correction by the transfer robot 32 holding the substrate.

Accordingly, the substrate processing method can perform the one-by-one correction at a more appropriate timing.

Further, the period for the plurality of operations of the transfer module TM to which the substrate is transferred next includes a period for placing the substrate (wafer W) held by the transfer robot 32 of the transfer module TM to which the substrate is transferred next on the pass module PASM, and a period for transferring the substrate placed on the pass module PASM by the transfer robot 32 of the transfer module TM to which the substrate is transferred next.

Accordingly, the substrate processing method can make the determination taking into consideration the period of the operation performed by the transfer robot 32 in the transfer module TM to which the substrate is transferred next, and the timing for performing the one-by-one correction can be set more appropriately.

Further, the substrate transfer method further includes:

detecting positions of the plurality of substrates with respect to the transfer robot 32 when the transfer robot 32 carries the plurality of substrates from the process module PM to the transfer module TM in a state in which the transfer robot 32 holds the plurality of substrates (wafer W); and when a position of at least one of the plurality of substrates is deviated by a predetermined value or more, determining whether to perform the one-by-one correction or the average correction, and transferring the plurality of substrates based on a result of the determining.

Accordingly, the substrate processing method can immediately determine whether to perform the one-by-one correction or the average correction when the substrate is positionally deviated by the transfer robot 32, and can transfer the substrate satisfactorily.

In another aspect, a semiconductor manufacturing system 1 for transferring a plurality of substrates (wafer W), the semiconductor manufacturing system includes:

a plurality of transfer modules TM provided with a transfer robot 32 configured to transfer the plurality of substrates;

a pass module PASM arranged between the plurality of transfer modules TM;

one or more process modules PM connected to the plurality of transfer modules TM, the one or more process modules PM being configured to perform substrate processing on the plurality of substrates transferred by a corresponding transfer module of the plurality of transfer modules TM; and a control device 80 configured to transfer the substrate from one of the plurality of transfer modules TM to the process module PM connected to another one of the plurality of transfer modules TM via the pass module PASM by controlling the transfer robot 32, wherein when the plurality of substrates are carried into the pass module PASM, the control device 80 makes a determination as to whether to perform one-by-one correction in which the plurality of substrates are placed on a plurality of stages 44 of the pass module PASM upon correcting positions of the plurality of substrates on a one-by-one basis or to perform average correction in which the plurality of substrates are placed on the plurality of stages 44 collectively upon taking an average value of the positions of the plurality of substrates.

In this case also, the semiconductor manufacturing system 1 can improve the accuracy of placing the substrate on the stages 44 and 54 while improving the substrate transfer efficiency.

The substrate transfer method and the semiconductor manufacturing system 1 according to the disclosed embodiment are exemplary in all respects and not restrictive. The embodiments can be modified and improved in various ways without departing from the scope of the appended claims. The matters described in the above embodiments can be incorporated in other configurations as long as there is no contradiction, and can be combined as long as there is no contradiction.

The present application claims the priority of basic application No. 2022-32880 filed with the Japan Patent Office on Mar. 3, 2022, the entire contents of which are incorporated herein by reference.

REFERENCE SIGNS LIST 1 semiconductor manufacturing system
32 transfer robot
44, 54 stage
80 control device
PM process module
PASM pass module
TM transfer module
W wafer

The invention claimed is:

1. A substrate transfer method of transferring a plurality of substrates, the substrate transfer method involving a plurality of transfer modules provided with a transfer robot configured to transfer the plurality of substrates;

a pass module arranged between the plurality of transfer modules; and one or more process modules connected to the plurality of transfer modules, the one or more process modules being configured to perform substrate processing on the plurality of substrates transferred by a corresponding transfer module of the plurality of transfer modules, the substrate transfer method comprising:

in a case where the substrate is transferred from one of the plurality of transfer modules to the process module connected to another one of the plurality of transfer modules via the pass module by controlling the transfer robot, when the plurality of substrates are carried into the pass module, making a determination as to whether to perform one-by-one correction in which the plurality of substrates are placed on a plurality of stages of the pass module upon correcting positions of the plurality of substrates on a one-by-one basis or to perform average correction in which the plurality of substrates are placed on the plurality of stages collectively upon taking an average value of the positions of the plurality of substrates.

2. The substrate transfer method according to claim 1, wherein:

the determination as to whether to perform the one-by-one correction or the average correction is made by comparing a remaining period until the process module ends the substrate processing for the transfer module having the transfer robot holding the substrate, with an addition period obtained by adding periods required for a plurality of operations of the transfer robot including a period during which the transfer robot holding the substrate performs the one-by-one correction and places the substrate on the pass module;

when the remaining period is shorter than the addition period, determining that there is no margin for the one-by-one correction by the transfer robot holding the substrate; and when the remaining period is greater than or equal to the addition period, determining that there is a margin for the one-by-one correction by the transfer robot holding the substrate.

3. The substrate transfer method according to claim 2, wherein the period for the plurality of operations of the transfer robot includes a period for the transfer robot holding the substrate to perform the one-by-one correction and place the substrate on the pass module, a period for transferring the substrate in the pass module to another module, and a period for transferring the substrate in the other module to the process module.

4. The substrate transfer method according to claim 2, further comprising:

making a setting to perform the average correction when placing the plurality of substrates on the pass module in a case of determining that there is no margin for the one-by-one correction by the transfer robot holding the substrate, and to perform the one-by-one correction when placing the plurality of substrates inside the process module of the transfer module to which the substrate is transferred next via the pass module.

5. The substrate transfer method according to claim 2, further comprising:

in a case of determining that there is a margin for the one-by-one correction by the transfer robot holding the substrate, further determining whether there is an empty module in one or more of the process modules connected to the transfer module to which the substrate is transferred next via the pass module.

6. The substrate transfer method according to claim 5, further comprising:

making a setting to perform the one-by-one correction when placing the plurality of substrates on the pass module in a case where there is an empty module in one or more of the process modules.

7. The substrate transfer method according to claim 5, further comprising:

when there is no empty module in one or more of the process modules, comparing a redetermined remaining period of substrate processing of one or more of the process modules connected to the transfer module to which the substrate is transferred next via the pass module, with a redetermined addition period obtained by adding a period during which the transfer robot holding the substrate performs the one-by-one correction and places the substrate on the pass module to a period during which a plurality of operations of the transfer module to which the substrate is transferred next are performed;

when the redetermined remaining period is shorter than the redetermined addition period, determining to perform the one-by-one correction by the transfer robot holding the substrate; and when the redetermined remaining period is greater than or equal to the redetermined addition period, determining to perform the average correction by the transfer robot holding the substrate.

8. The substrate transfer method according to claim 7, wherein the period for the plurality of operations of the transfer module to which the substrate is transferred next includes a period for placing the substrate held by the transfer robot of the transfer module to which the substrate is transferred next on the pass module, and a period for transferring the substrate placed on the pass module by the transfer robot of the transfer module to which the substrate is transferred next.

9. The substrate transfer method according to claim 1, further comprising:

detecting positions of the plurality of substrates with respect to the transfer robot when the transfer robot carries the plurality of substrates from the process module to the transfer module in a state in which the transfer robot holds the plurality of substrates; and when a position of at least one of the plurality of substrates is deviated by a predetermined value or more, determining whether to perform the one-by-one correction or the average correction, and transferring the plurality of substrates based on a result of the determining.

10. A semiconductor manufacturing system for transferring a plurality of substrates, the semiconductor manufacturing system comprising:

a plurality of transfer modules provided with a transfer robot configured to transfer the plurality of substrates;

a pass module arranged between the plurality of transfer modules;

one or more process modules connected to the plurality of transfer modules, the one or more process modules being configured to perform substrate processing on the plurality of substrates transferred by a corresponding transfer module of the plurality of transfer modules; and a control device configured to transfer the substrate from one of the plurality of transfer modules to the process module connected to another one of the plurality of transfer modules via the pass module by controlling the transfer robot, wherein when the plurality of substrates are carried into the pass module, the control device makes a determination as to whether to perform one-by-one correction in which the plurality of substrates are placed on a plurality of stages of the pass module upon correcting positions of the plurality of substrates on a one-by-one basis or to perform average correction in which the plurality of substrates are placed on the plurality of stages collectively upon taking an average value of the positions of the plurality of substrates.

* * * * *